US012692438B2

(12) United States Patent     (10) Patent No.:   US 12,692,438 B2

Berends et al.     (45) Date of Patent:     Jul. 28, 2026

(54) Y2O3:RE NANOPARTICLES

(71) Applicant: Seaborough Materials IP B.V., Amsterdam (NL)

(72) Inventors: Anne Claire Berends, Utrecht (NL); Marie Anne Van De Haar, Weesp (NL)

(73) Assignee: Seaborough Materials IP B.V., Amsterdam (NL)

( * ) Notice: Subject to any disclaimer, the term of this patent is extended or adjusted under 35 U.S.C. 154(b) by 181 days.

(21) Appl. No.: 18/009,756

(22) PCT Filed: Jun. 11, 2021

(86) PCT No.: PCT/EP2021/065865

§ 371 (c)(1),
(2) Date: Dec. 12, 2022

(87) PCT Pub. No.: WO2021/250268

PCT Pub. Date: Dec. 16, 2021

(65) Prior Publication Data

US 2023/0295498 A1     Sep. 21, 2023

(30) Foreign Application Priority Data

Jun. 12, 2020    (EP) .................................... 20179805

(51) Int. Cl.

| | |
|---|---|
| *C09K 11/77* | (2006.01) |
| *B82Y 20/00* | (2011.01) |
| *B82Y 40/00* | (2011.01) |
| *C01F 17/218* | (2020.01) |
| *H10H 20/851* | (2025.01) |

(52) U.S. Cl.

CPC ........ *C09K 11/7787* (2013.01); *C01F 17/218* (2020.01); *C09K 11/7769* (2013.01); *C09K 11/7774* (2013.01); *B82Y 20/00* (2013.01); *B82Y 40/00* (2013.01); *C01P 2002/54* (2013.01); *C01P 2002/72* (2013.01); *C01P 2002/76* (2013.01); *C01P 2004/04* (2013.01); *C01P 2004/24* (2013.01); *C01P 2004/64* (2013.01); *C01P 2006/60* (2013.01); *H10H 20/8512* (2025.01)

(58) Field of Classification Search

CPC ... C01F 17/218; C09K 1/7767; C09K 1/7769; C09K 1/7774

See application file for complete search history.

(56) References Cited

U.S. PATENT DOCUMENTS

| | | |
|---|---|---|
| 2006/0133978 A1 | 6/2006 | Williams |
| 2019/0249081 A1 | 8/2019 | Collins |

FOREIGN PATENT DOCUMENTS

| | | | |
|---|---|---|---|
| CN | 1687306 | * | 10/2005 |
| CN | 1687306 A | | 10/2005 |
| CN | 110431673 A | | 11/2019 |
| JP | 2007046022 | * | 2/2007 |
| KR | 2010-0112404 | * | 10/2010 |

OTHER PUBLICATIONS

De Moura et al, "Photoluminescent Propeties of Nanorods and Nanoplates Y2O3:Eu3+", J. Fluorence (2011), 21:1431-1438, Jan. 15, 2011.*

Translation for CN 1687306, Oct. 26, 2005.*

Wei Cheng et al., 'Three-Dimensional Assembly of Yttrium Oxide Nanosheets into Luminescent Aerogel Monoliths with Outstanding Adsorption Properties', ACS Nano, vol. 10, Jan. 12, 2016, pp. 2467-2475.

Ana Paula De Moura, et al., "Photolumiscent Properties of Nanorods and Nanoplates YO:Eu", Journal of Fluorescence, Kluwer Academic Publishers-Plenum Publishers, NE, vol. 21, No. 4, Jan. 15, 2011 (Jan. 15, 2011), pp. 1431-1438.

"Upconverting Lanthanide-doped Y2O3 Nanoparticles for Phototherapy", Arend Zhang, pp. 1-49.

"Mineralizer-Assisted Shape-Control of Rare Earth Oxide Nanoplates", DianyuanWang, Chem. Mater., vol. 26, pp. 6328-6332.

* cited by examiner

*Primary Examiner* — C Melissa Koslow

(74) *Attorney, Agent, or Firm* — Benjamin D. Van Der Sman; Hoyng Rokh Monegier B.V.

(57) ABSTRACT

The invention provides $Y_2O_3$:RE nanoparticles having a cubic crystal structure, wherein RE is a trivalent rare earth metal ion. The invention further provides a method of preparing $Y_2O_3$:RE nanoparticles, comprising: a) providing a mixture comprising (i) an yttrium salt and/or yttrium alkoxide, (ii) a rare earth metal salt and/or rare earth metal alkoxide, and (iii) an organic solvent; b) optionally, subjecting the mixture to a pre-treatment step which comprises heating the mixture at a temperature of at least 80° C. and/or at a temperature such that crystal water and/or organic impurities are removed, c) heating the mixture at a temperature between 220° C. and 320° C. and/or at a temperature such that a precursor complex forms; d) subjecting the mixture to a precipitation stage, wherein a precipitate forms, said precipitation stage preferably comprising allowing the mixture to cool and/or adding an antisolvent to the mixture; and e) heating the precipitate at a temperature between 600° C. and 900° C. and/or at a temperature such that a cubic $Y_2O_3$ crystal structure forms, preferably for at least 10 minutes.

20 Claims, 11 Drawing Sheets

Y2O3:RE NANOPARTICLES

CROSS REFERENCE TO RELATED APPLICATIONS

This application is a U.S. National Stage application under 35 U.S.C 371 of PCT application number PCT/EP2021/065865 filed on Jun. 11, 2021, which claims priority from EP Application Serial No. 20179805.5 filed on Jun. 24, 2021. Both applications are hereby incorporated by reference in their entirety.

FIELD OF THE INVENTION

The invention provides $Y_2O_3$:RE nanoparticles, methods for the preparation of $Y_2O_3$:RE nanoparticles, and compositions comprising $Y_2O_3$:RE nanoparticles.

BACKGROUND OF THE INVENTION

Luminescent down-conversion materials play an important role in solid-state lighting devices for illumination and display applications, among others.

$Y_2O_3$:Eu is a well-known material on micron-scale used in fluorescent tubes, among others.

WO2012/091778 is directed to monodisperse particles which are morphologically and size uniform, and their shape-directed self-assembly. It discloses a preparation of $Y_2O_3$:Yb,Er spherical hexagons. The arrangement in spherical hexagons indicates that the material has a hexagonal crystal structure.

WO2018/167266 discloses compositions comprising a light emitting material and a sensitizer material, wherein the light emitting material and the sensitizer material are selected such that the sensitizer material has an emission spectrum which overlaps at least partly with one or more excitation bands of the light emitting material and wherein the light emitting material and sensitizer material are so arranged to each other to allow non-radiative energy transfer from the sensitizer material to the light emitting material. This application also describes methods for the preparation thereof.

Non-radiative energy transfer (sometimes also referred to as Fluorescent Resonance Energy Tranfer, FRET) from the sensitizer material to the light emitting material involves the non-radiative transfer of energy from an excited sensitizer ion in the sensitizer material to an acceptor (or emitter) ion in the light emitting material. It is evidenced by increased emission from an emitter ion in the light emitting material upon selective excitation of the sensitizer ion in the sensitizer material.

Nanomaterials are of interest due to their high surface area and small volume, which enables to arrange luminescent materials close in space to harness inter-particle FRET.

SUMMARY OF THE INVENTION

According to the invention there are provided $Y_2O_3$:RE nanoparticles having a cubic crystal structure, wherein RE is a trivalent rare earth ion.

According to the invention there is further provided a method for preparing $Y_2O_3$:RE nanoparticles, comprising:

a) providing a mixture comprising (i) an yttrium salt and/or yttrium alkoxide, (ii) a rare earth metal salt and/or rare earth metal alkoxide, and (iii) an organic solvent;

b) optionally, subjecting the mixture to a pre-treatment step which comprises heating the mixture at a temperature of at least 80° C. and/or at a temperature such that crystal water and/or organic impurities are removed, c) heating the mixture at a temperature between 220° C. and 320° C. and/or at a temperature such that a precursor complex forms;

d) subjecting the mixture to a precipitation stage, wherein a precipitate forms, said precipitation stage preferably comprising allowing the mixture to cool and/or adding an antisolvent to the mixture; and e) heating the precipitate at a temperature between 600° C. and 900° C. and/or at a temperature such that a cubic $Y_2O_3$ crystal structure forms, preferably for at least 10 minutes.

According to the invention there is further provided a luminescent composition comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein at least one of said first luminescent material or said second luminescent material comprises the nanoparticles according to the invention.

The nanoparticles of the invention show good absorption/emission properties and are suited for mixing in luminescent compositions. They have few crystal defects and are highly crystalline at small sizes. They can advantageously be used in compositions, wherein non-radiative energy transfer (sometimes also referred to as Fluorescent Resonance Energy Tranfer, FRET) is desired.

The methods of the invention allow to obtain the nanoparticles according to the invention.

DETAILED DESCRIPTION OF THE INVENTION

Nanoparticles

Figure 1:
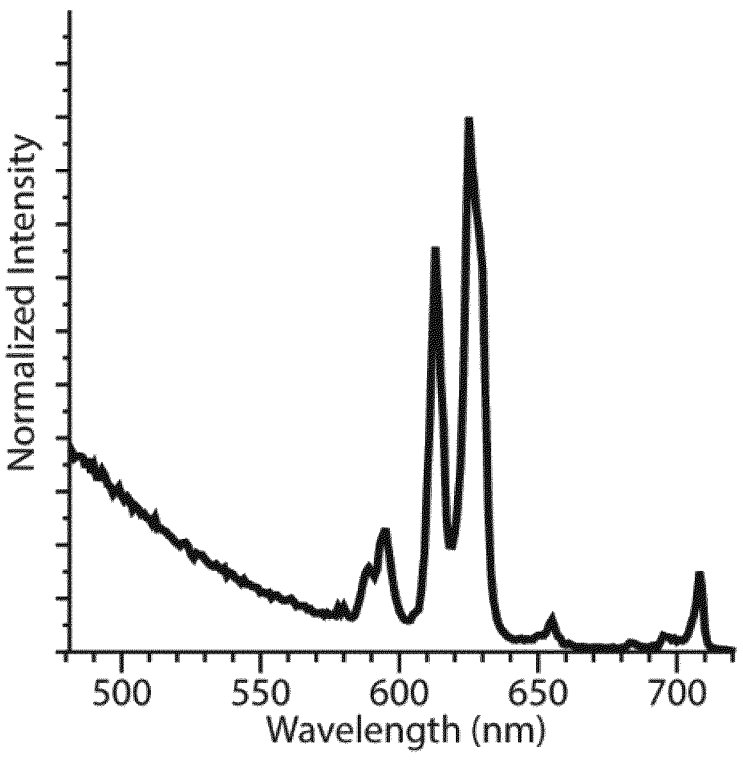
FIG. 1 shows an emission spectrum of a $Y_2O_3$:Eu³⁺ precursor complex, with excitation at 395 nm.

The nanoparticles according to the invention are $Y_2O_3$:RE nanoparticles having a cubic crystal structure, wherein RE is a trivalent rare earth ion.

The cubic crystal structure has been found to result in good absorption/emission properties.

Preferably, RE is an europium(III) or terbium(III) ion or a combination thereof. $Eu^{3+}$ shows, upon suitable excitation, red-emission. $Tb^{3+}$ shows, upon suitable excitation, yellow-green emission.

Preferably, the doping ratio is at least 10% for europium doped nanoparticles, more preferably the doping ratio is between 15% and 80%. As used herein, the doping ratio is the percentage of doping ions relative to the total of doping ions and yttrium atoms in the crystal lattice.

Preferably, the doping ratio is at least 15% for terbium doped nanoparticles, more preferably, the doping ratio is between 30% and 80%.

Preferably, in the case of nanoparticles co-doped with both europium and terbium, the doping ratio of europium is between 15% and 50%, and the doping ratio of terbium is at least 15%.

Nanoparticles according to the invention include particles of which at least one dimension is at a nanometre scale, preferably ≤100 nm. Preferably, the nanoparticles according to the invention have at least one dimension ≤70 nm. Furthermore, the $D_{50}$ value of the smallest dimension of the nanoparticles is preferably ≥0.5 nm and ≤100 nm, more preferably ≥0.5 nm and ≤50 nm, most preferably ≥0.5 nm and ≤10 nm, as measured using transmission electron microscopy (TEM). $D_{50}$ is defined as the median value of the length of the smallest dimension of the nanoparticles, measured from an ensemble of at least 50 representative particles.

Preferably, the nanoparticles are nanoplatelets. The term nanoplatelet is well known to the skilled person and encompasses a particle having larger sizes of the lateral dimensions than the size of the thickness (size of the smallest dimension). For instance, the nanoplatelets may be nanoparticles of which the size of at least one, but preferably of both other dimensions than that of the smallest dimension is at least 5 times, preferably at least 10 times the size of the smallest dimension of the particle. The nanoplatelets may for instance have in at least one, preferably two dimensions a size of ≥5 nm and ≤500 nm, preferably ≥50 nm and ≤500 nm, and a thickness ≥0.5 nm and ≤10 nm.

Preferably one dimension of the platelet is ≥0.5 nm and ≤10 nm, as measured using transmission electron microscopy (TEM).

Preferably, the nanoparticles according to the invention are capable of luminescence.

Preferably, the $Y_2O_3$:RE nanoparticles according to the invention are capable of emitting in the red and/or green spectral range. As used herein, the term red emitting material refers to a material which, upon suitable excitation, has one or more emission bands between 600 nm and 700 nm. As used herein, the term green emitting material refers to a material, which, upon suitable excitation, has one or more emission bands between 510 nm to 560 nm.

More preferably, the $Y_2O_3$:RE nanoparticles wherein RE is europium or terbium or both europium and terbium according to the invention are capable of emitting in the red and/or green spectral range.

Preparation

The invention provides a method for preparing $Y_2O_3$:RE nanoparticles.

The methods according to the invention enable to obtain the nanoparticles according to the invention.

Stage a)

The method according to the invention for preparing $Y_2O_3$:RE nanoparticles comprises providing a mixture comprising (i) an yttrium salt and/or yttrium alkoxide, (ii) a rare earth metal salt and/or rare earth metal alkoxide and (iii) an organic solvent.

The rare earth metal ion (RE) is preferably europium(III) and/or terbium(III).

Any suitable yttrium salt and/or alkoxide and rare earth metal salt and/or alkoxide may be used that dissolves in the organic solvent.

Preferably, the yttrium salt is selected from the group consisting of halides, acetates, acetylacetonates, sulfates, nitrates, and/or hydrated versions of these substances.

Preferably, the yttrium alkoxide has the formula $Y(OR)_3$, wherein $RO^-$ is the alkoxide and R is a C1-C4 group. Preferably, the alkoxide is an isopropoxide, ethoxide and/or tert-butoxide.

Preferably, the rare earth metal salt is selected from the group consisting of halides, acetates, acetylacetonates, sulfates, nitrates, and/or hydrated versions of these substances.

Preferably, the rare earth metal alkoxide has the formula $RE(OR)_3$, wherein $RO^-$ is the alkoxide and R is a C1-C4 group. Preferably, the alkoxide is an isopropoxide, ethoxide and/or tert-butoxide.

The skilled person is able to determine the relative amounts of the salts and/or alkoxides such as to obtain the desired ratios of the ions in the nanoparticles.

The mixture comprises an organic solvent. The organic solvent is preferably a high boiling point solvent. The boiling point of the solvent is preferably at least 220° C. at a pressure of $10^5$ Pa, more preferably at least 260° C. at a pressure of $10^5$ Pa, more preferably at least 320° C. at a pressure of $10^5$ Pa, or at least higher than the temperatures of stages b) and c). The organic solvent is preferably chosen from the group of 1-octadecene, oleylamine, octadecylamine, oleic acid, or a mixture thereof. The mixing ratio preferably is 0.1-1 mmol salts to 20 mL solvent.

Stage b)

The method according to the invention may, optionally, comprise subjecting the mixture to a pre-treatment step which comprises heating the mixture at a temperature of at least 80° C. and/or at a temperature such that crystal water and/or organic impurities are removed.

The pre-treatment step has the objective to remove crystal water and other impurities from the salts and the solvents in the mixture. This may be achieved at any temperature suitable to achieve this purpose.

The mixture may be heated at a temperature of at least 80° C. The temperature may be about 100° C. under atmospheric pressure or at least about 80° C. under vacuum, and/or a temperature such that impurities are removed. The mixture is heated to at least a temperature such that water evaporates. For example, at atmospheric pressure, the mixture is heated to at least 100° C.

Preferably, the mixture is heated at at least about 100° C. and at most about 180° C. under atmospheric pressure, or at least about 80° C. and at most about 130° C. under vacuum. This allows to remove crystal water and other impurities from the mixture.

Preferably, the mixture is heated for at least 10 minutes, more preferably for 10 to 420 minutes, or a time sufficient such that the impurities are removed. The pre-treatment step may be longer when using larger volumes.

Stage c)

The method according to the invention comprises heating the mixture at a temperature between 220° C. and 320° C. and/or at a temperature such that a precursor complex forms.

Preferably, the mixture is heated for at least about 15 minutes. More preferably, the mixture is heated for about 30 minutes to about 120 minutes and possibly longer when using larger volumes.

The mixture may be heated in inert conditions, but this is not necessary. Without being bound by theory, it is thought that the heating step allows precursor complexes to form.

Stage d)

The method according to the invention comprises subjecting the mixture to a precipitation stage, wherein a precipitate forms, said precipitation stage preferably comprising allowing the mixture to cool and/or adding an antisolvent to the mixture. Preferably, the antisolvent is a polar organic solvent, more preferably an alcohol or ketone, more preferably a C1-C4 alcohol or ketone, more preferably methanol, ethanol, propanol or acetone. The addition of antisolvent facilitates precipitation and the separation of the precipitate. Preferably, the antisolvent has a relatively low boiling point, as this facilitates removal of the liquid later in the process.

As a result of the precipitation stage a precipitate forms. The precipitate may be separated by any means known in the art, such as allowing the precipitate to sediment, centrifuging, filtration, etc.

Preferably, the separated precipitate is dried. This allows to arrive at the desired temperature quicker and in a more controlled manner in stage e).

Stage e)

The method according to the invention comprises heating the precipitate at a temperature between 600° C. and 900° C. and/or at a temperature such that a cubic $Y_2O_3$ crystal structure forms.

Preferably, the precipitate is heated for at least 5 minutes, preferably about 10 minutes, more preferably about 10 minutes to 60 minutes.

Without being bound by theory, it is thought that the heating step allows the material to crystallize in the desired cubic crystal structure.

Luminescent Composition and Preparation Thereof

The invention further provides a luminescent composition comprising the nanoparticles according to the invention.

Preferably, the luminescent composition comprises a first luminescent material and a second luminescent material wherein at least one of said first luminescent material or said second luminescent material comprises nanoparticles according to the invention.

Preferably, the luminescent composition comprises a first luminescent material capable of emitting light in a first wavelength range and a second luminescent material being capable of absorbing light in a second wavelength range, and having an emission spectrum which overlaps at least partly with one or more of the excitation bands of said first luminescent material.

The first luminescent material is capable of emitting light in a first wavelength range. The skilled person will understand that the first luminescent material functions as an emitting material in the composition according to the invention. The first wavelength range may be any wavelength range of interest. Preferred wavelength ranges will be described hereinafter.

The second luminescent material is capable of absorbing light in a second wavelength range. The skilled person will understand that the second luminescent material functions as a sensitizer material according to the invention. The second wavelength range may be any wavelength range of interest. Preferred wavelength ranges will be described hereinafter.

The second luminescent material has, when excited by light in the second wavelength range, an emission spectrum which overlaps at least partly with one or more excitation bands of said first luminescent material. The skilled person is well able to determine the overlap of the spectra based on spectra known in the art or by determining the spectra by routine experimentation, which is for example disclosed in WO2020/053429.

Preferably, the overlap of said emission spectrum of said second material and one or more excitation bands of said first material is in the blue (440 to 480 nm), green (510 to 560 nm) or yellow (560 to 580 nm) wavelength range.

Preferably, said first luminescent material and said second luminescent material are so arranged to each other to allow non-radiative energy transfer (sometimes also referred to as Fluorescent Resonance Energy Transfer, FRET) from said second luminescent material (sensitizer material) to said first luminescent material (emitter material). Generally, this comprises close proximity between the first and second luminescent materials, for instance from about 0.5 nm to about 20 nm in distance. The skilled person is well aware how non-radiative energy transfer may be achieved. This is, for instance, described in WO2018/167266, the contents of which are herewith incorporated by reference. The skilled person will understand that non-radiative energy transfer involves non-radiative transfer of energy from an excited sensitizer material to an acceptor (or emitter) ion in the emitting material. It is evidenced by increased selective excitation of the sensitizer material resulting in increased emission from an emitter ion in the emitting material. The non-radiative energy transfer of interest may originate from either Forster- or Dexter-type energy transfer. The skilled person will realize that—since resonant energy transfer is in first order inversely proportional to inter-ion distance at the power of 6 (in case of Forster-type energy transfer), or exponentially proportional to the distance (in case of Dexter-type energy transfer)—the arrangement to allow non-radiative energy transfer may be effected by proper engineering of the effective distances between the sensitizer material and the emitter ions in the emitting material.

The first luminescent material and/or the second luminescent material are $Y_2O_3$:RE nanoparticles. This allows a large contact surface between the first and second material, which (further) enables non-radiative energy transfer to occur. The $Y_2O_3$:RE nanoparticles have desirable luminescent properties.

Preferably, said first luminescent material are the $Y_2O_3$: RE nanoparticles or nanoplatelets according to the invention. The $Y_2O_3$:RE nanoparticles according to the invention are well suited for use in luminescent compositions. More preferably, RE is europium(III), terbium(III), or europium (III) and terbium(III). These ions have desired absorption/emission characteristics.

Preferably said first luminescent material and said second luminescent material are in the form of nanoparticles. Suitable nanoparticles include particles of which at least one dimension is at a nanometer scale, preferably ≤100 nm. The small size allows smaller distances between the surfaces of the first and second material, which (further) enables inter-particle non-radiative energy transfer to occur. Providing both materials in the form of nanoparticles allows more efficient mixing and even distribution of the particles, which further promotes inter-particle non-radiative energy transfer to occur.

As discussed, the $D_{50}$ value of the smallest dimension of the nanoparticles is preferably ≥0.5 nm and ≤100 nm, more preferably ≥0.5 nm and ≤50 nm, most preferably ≥0.5 nm and ≤10 nm, as measured using transmission electron microscopy (TEM). $D_{50}$ is defined as the median value of the length of the smallest dimension of the nanoparticles, measured from an ensemble of at least 50 representative particles.

In another preferred embodiment, the second luminescent material is provided as a bulk material with the first luminescent material provided on the second luminescent material. In this context the term "bulk" especially means and/or includes greater than nanoscale, for example greater than 100 nm in diameter and including micro-size scales.

The First Luminescent Material

As discussed, the second luminescent material may comprise nanoparticles according to the invention. In compositions wherein the second luminescent material comprises the nanoparticles according to the invention, the first luminescent material is preferably as described below.

The first luminescent material is capable of emitting light in a first wavelength range. The first wavelength range may be any wavelength range of interest.

Preferably, the first luminescent material comprises a red or green emitting material. As used herein the term red emitting material refers to a material which, upon suitable excitation, has one or more emission bands between 600 nm and 700 nm and the term green emitting material refers to a material which, upon suitable excitation, has one or more emission bands between 510 and 560 nm. Providing a red or green emitting material can be desirable for color rendering purposes. According to alternative aspects of the invention, the first luminescent material is a material having, upon suitable excitation, one or more emission bands between 700 and 1400 nm (IR-A), between 580 and 600 nm (amber and/or orange), between 560 and 580 nm (yellow), between 480 and 510 nm (cyan), between 440 and 480 nm (blue), between 400-440 nm (violet), between 315-400 nm (UV-A), and/or between 280-315 nm (UV-B).

In a preferred embodiment, the first luminescent material comprises a rare-earth doped phosphor material. The phosphor materials may be divalent or trivalent rare-earth doped phosphors. Examples of suitable rare-earth doped phosphor materials include, but are not limited to: $LaPO_4$:$Eu^{3+}$ (and/or $Tb^{3+}$), $CaAlSiN_3$:$Eu^{2+}$, $Y_2O_3$:$Eu^{3+}$ (and/or $Tb^{3+}$), $Y(V,P)O_4$:$Eu^{3+}$ (and/or $Tb^{3+}$), $Lu_3Al_5O_{12}$:$Ce^{3+}$ (or $Eu^{3+}$ and/or $Tb^{3+}$), $Y_3Al_5O_{12}$:$Ce^{3+}$ (or $Eu^{3+}$ and/or $Tb^{3+}$), $BaMgAl_{14}O_{23}$:$Mn^{2+}$, $Mg(Al,Ga)_2O_4$:$Mn^{2+}$, $Zn_2SiO_4$:$Mn^{2+}$, $K_2SiF_6$:$Mn^{4+}$, $MgF_2{\cdot}GeO_2$:$Mn^{4+}$, and combinations thereof.

Phosphor materials may be procured today on the open market, or may be synthesized, for example as described in [Riwotzki, K.; Meyssamy, H.; Kornowski, A.; Haase, M. *J. Phys. Chem. B*. 2000, 104, 2824-2828].

As is known to the skilled person, rare-earth doped phosphor materials comprise a host lattice doped with optically active ions.

The first luminescent material may have any suitable host lattice. The host lattice may for instance be selected from the group consisting of oxides, fluorides, nitrides, borates, garnets, molybdates, phosphates, vanadates, chlorides, sulfides, selenides, silicates, aluminates, oxyfluorides, oxychlorides, oxynitrides, oxysulfides, oxyselenides, fluorochlorides, fluorosilicates and fluorobromides or combinations of these or another inorganic host material in which the optically active ions can be incorporated.

Preferably, the host lattice of the first luminescent material is an oxide, phosphate, vanadate or a combination thereof, more preferably selected from the group consisting of $Y_3Al_5O_{12}$ ("YAG"), $Lu_3Al_5O_{12}$ ("LuAG"), $Y_2O_3$, $YVPO_4$, $YVO_4$ or $LaPO_4$ or a combination thereof. Preferably, said preferred host lattice of the first luminescent material is doped with one or more ions selected from the group consisting of $Eu^{3+}$, $Tb^{3+}$, $Mn^{2+}$ and $Mn^{4+}$. These ions provide good emission characteristics, such as emission bands that are strong and/or in the red or green part of the visible spectrum.

In case of $Eu^{3+}$ doping, the first luminescent material may for example have a host lattice doped having a doping ratio of at least 10%, more preferably having a doping ratio of between 15% and 80%. In case $Tb^{3+}$ doping, the first luminescent material may for example have a host lattice doped having a doping ratio of at least 15%, more preferably between 30% and 80% $Tb^{3+}$. In case of $Mn^{4+}$ doping, the first luminescent material may for example have a host lattice doped having a doping ratio of 0.1-30%, most preferably between 1-10%. In case of $Mn^{2+}$ doping, the first luminescent material may for example have a host lattice doped having a doping ratio of 0.1-30%, most preferably between 1-10%.

In an exemplary embodiment, the first luminescent material is selected from the group consisting of $(Ca,Sr)Ga_2O_6$:$Eu^{3+}$ (or $Tb^{3+}$), $(Ca,Sr,Ba)La_2Bi_2(SiO_4)_3O$:$Eu^{3+}$ (or $Tb^{3+}$), $(Ca,Sr,Ba)SnO_3$:$Eu^{3+}$ (and/or $Tb^{3+}$), $(Ca,Y,Gd)MoO_4$:$Eu^{3+}$ (or $Tb^{3+}$), $(Y,Gd)BO_3$ (pseudo-vaterite):$Eu^{3+}$ (or $Tb^{3+}$), $(Y,Tb)SiO_5$:$Eu^{3+}$ (or $Tb^{3+}$), $A$-$La_2O_3$:$Eu^{3+}$ (or $Tb^{3+}$), $Ba_2(SiO_4)$:$O_2$:$Eu^{3+}$ (or $Tb^{3+}$), $Ba_2MgSi_2O_7$:$Eu^{3+}$ (or $Tb^{3+}$), $Ba_2Y(BO_3)_2Cl$:$Eu^{3+}$ (or $Tb^{3+}$), $Ba_3(PO_4)_2$:$Eu^{3+}$ (or $Tb^{3+}$), $Ba_3Ca_3(PO_4)_4$:$Eu^{3+}$ (or $Tb^{3+}$), $Ba_3Gd(BO_3)_3$:$Eu^{3+}$ (or $Tb^{3+}$), $Ba_3Gd_2(BO_3)_4$:$Eu^{3+}$ (or $Tb^{3+}$), $Ba_3La_2(BO_3)_4$:$Eu^{3+}$ (or $Tb^{3+}$), $Ba_3V_2O_8$:$Eu^{3+}$ (or $Tb^{3+}$), $Ba_3Y_2(BO_3)_4$:$Eu^{3+}$ (or $Tb^{3+}$), $BaB_8O_{13}$:$Eu^{3+}$ (or $Tb^{3+}$), $BaBPO_5$:$Eu^{3+}$ (or $Tb^{3+}$), $BaFCl$:$Eu^{3+}$ (or $Tb^{3+}$), $BaGd_2O_4$:$Eu^{3+}$ (or $Tb^{3+}$), $BaGd_4Si_5O_{17}$:$Sm$:$Eu^{3+}$ (or $Tb^{3+}$), $BaGdB_9O_{16}$:$Eu^{3+}$ (or $Tb^{3+}$), $BaLaB_9O_{16}$:$Eu^{3+}$ (or $Tb^{3+}$), $BaSO_4$:$Eu^{3+}$ (or $Tb^{3+}$), $BaY_2F_8$:$Yb$:$Eu^{3+}$ (or $Tb^{3+}$), $BaY_2Si_3O_{10}$:$Eu^{3+}$ (or $Tb^{3+}$), $BaYB_9O_{16}$:$Eu^{3+}$ (or $Tb^{3+}$), $BaZr(BO_3)_2$:$Eu^{3+}$ (or $Tb^{3+}$), $BaZrO_3$:$Eu^{3+}$ (or $Tb^{3+}$), $BaZrO_3$:$Eu^{3+}$ (or $Tb^{3+}$), $b$-$BaB_2O_4$:$Eu^{3+}$ (or $Tb^{3+}$), $B$—$Gd_2O_3$:$Eu^{3+}$ (or $Tb^{3+}$), $Ca_2Al(AlSiO_7)$:$Eu^{3+}$ (or $Tb^{3+}$), $Ca_2Gd_2(GeO_4)_2O$:$Eu^{3+}$ (or $Tb^{3+}$), $Ca_2Gd_8(SiO_4)_6O_2$:$Eu^{3+}$ (or $Tb^{3+}$), $Ca_2Gd_8Si_6O_{26}$:$Eu^{3+}$ (or $Tb^{3+}$), $Ca_2La_8(SiO_4)_6O_2$:$Eu^{3+}$ (or $Tb^{3+}$), $Ca_3(BO_3)_2$:$Eu^{3+}$ (or $Tb^{3+}$), $Ca_3Al_2O_6$:$Eu^{3+}$ (or $Tb^{3+}$), $Ca_3Gd_2(BO_3)_4$:$Eu^{3+}$ (or $Tb^{3+}$), $Ca_3La_2(BO_3)_4$:$Eu^{3+}$ (or $Tb^{3+}$), $Ca_3Y_2(BO_3)_4$:$Eu^{3+}$ (or $Tb^{3+}$), $Ca_4GdO(BO_3)_3$:$Eu^{3+}$ (or $Tb^{3+}$), $Ca_5(PO_{11})_3F$:$Eu^{3+}$ (or $Tb^{3+}$), $Ca_5(PO_4)_3Br$:$Eu^{3+}$ (or $Tb^{3+}$), $Ca_5(PO_4)_3F$:$(4f$-site$)$:$Eu^{3+}$ (or $Tb^{3+}$), $Ca_5(PO_4)_3F$:$(6h$-site$)$:$Eu^{3+}$ (or $Tb^{3+}$), $Ca_5(PO_4)_3OH$:$Eu^{3+}$ (or $Tb^{3+}$), $CaBPO_5$:$Eu^{3+}$ (or $Tb^{3+}$), $CaF_2$:$Eu^{3+}$ (or $Tb^{3+}$), $CaLaB_7O_{13}$:$Eu^{3+}$ (or $Tb^{3+}$), calcite-$CaCO_3$:$Eu^{3+}$ (or $Tb^{3+}$), $CaO$:$Eu^{3+}$ (or $Tb^{3+}$), $CaSO_4$:$Eu^{3+}$ (or $Tb^{3+}$), $CaYO(BO_3)$:$Eu^{3+}$ (or $Tb^{3+}$), $C$—$Gd_2O_3$:$Eu^{3+}$ (or $Tb^{3+}$), C—$Lu_2O_3$:($C_2$):$Eu^{3+}$ (or $Tb^{3+}$), C—$Lu_2O_3$:(C3i): $Eu^{3+}$ (or $Tb^{3+}$), $Cs_2NaYF_6$:$Tm$:$Eu^{3+}$ (or $Tb^{3+}$), C—$Sc_2O_3$: $Yb$:$Eu^{3+}$ (or $Tb^{3+}$), C—$Y_2O_3$:$Eu^{3+}$ (or $Tb^{3+}$), $Eu^{3+}$ (or $Tb^{3+}$)[(ttfa)3(phen)]0:$Eu^{3+}$ (or $Tb^{3+}$), $Gd_{17.33}(BO_3)_4(B_2$ $O_5)_2O_{16}$:$Eu^{3+}$ (or$Tb^{3+}$), $Gd_2BaZnO_5$:$Eu^{3+}$ (or $Tb^{3+}$), $Gd_2O_2$ $(SO_4)$:$Eu^{3+}$ (or $Tb^{3+}$), $Gd_2P_4O_{13}$:$Eu^{3+}$ (or $Tb^{3+}$), $Gd_3O_4Br$: $Eu^{3+}$ (or $Tb^{3+}$), $Gd_3PO_7$:$Eu^{3+}$ (or $Tb^{3+}$), $Gd_3Te_2Li_3O_{12}$:$Eu^{3+}$ (or $Tb^{3+}$), $Gd_8P_2O_{17}$:$Eu^{3+}$ (or $Tb^{3+}$), $GdAl_3$ $(BO_3)_4$:$Eu^{3+}$ (or $Tb^{3+}$), $GdAlO_3$:$Eu^{3+}$ (or $Tb^{3+}$), $GdAlO_3$:$Eu^{3+}$ (or $Tb^{3+}$), $GdB_3O_6$:$Eu^{3+}$ (or $Tb^{3+}$), $GdBO_3$:$Eu^{3+}$ (or $Tb^{3+}$), $GdGaO_3$: $Eu^{3+}$ (or $Tb^{3+}$), $GdOBr$:$Eu^{3+}$ (or $Tb^{3+}$), $GdOCl$:$Eu^{3+}$ (or $Tb^{3+}$), $GdP_3O_9$:$Eu^{3+}$ (or $Tb^{3+}$), $GdPO_4$:$Eu^{3+}$ (or $Tb^{3+}$), I—$CaB_2O_4$:$Eu^{3+}$ (or $Tb^{3+}$), $InBO_3$:$Eu^{3+}$ (or $Tb^{3+}$), I—$SrB_2O_4$:$Eu^{3+}$ (or $Tb^{3+}$), $KCaGd(PO_4)_2$:$Eu^{3+}$ (or $Tb^{3+}$), $La_{26}O_{27}(BO_3)_8$:$Eu^{3+}$ (or $Tb^{3+}$), $La_2BaZnO_5$:$Eu^{3+}$ (or $Tb^{3+}$), $La_2Hf_2O_7$:$Eu^{3+}$ (or $Tb^{3+}$), $La_2O_2(SO_4)$:$Eu^{3+}$ (or $Tb^{3+}$), $La_2O_2S$:$Eu^{3+}$ (or $Tb^{3+}$), $La_2W_3O_{12}$:$Eu^{3+}$ (or $Tb^{3+}$), $La_2Zr_3$ $(MoO_4)_9$:$Eu^{3+}$ (or $Tb^{3+}$), $La_3TaO_4Cl_6$:$Eu^{3+}$ (or $Tb^{3+}$), $La_3WO_6Cl_3$:$Eu^{3+}$ (or $Tb^{3+}$), $LaAlO_3$:$Eu^{3+}$ (or $Tb^{3+}$), $LaB_3O_6$:$Eu^{3+}$ (or $Tb^{3+}$), $LaBO_3$:$Eu^{3+}$ (or $Tb^{3+}$), $LaF_3$:$Eu^{3+}$ (or $Tb^{3+}$), $LaGaO_3$:$Eu^{3+}$ (or $Tb^{3+}$), $LaMgB_5O_{10}$:$Eu^{3+}$ (or $Tb^{3+}$), $LaOBr$:$Eu^{3+}$ (or $Tb^{3+}$), $LaOCl$:$Eu^{3+}$ (or $Tb^{3+}$), $LaOF$: $Eu^{3+}$ (or $Tb^{3+}$), $LaOI$:$Eu^{3+}$ (or $Tb^{3+}$), $LaP_3O_9$:$Eu^{3+}$ (or $Tb^{3+}$), $LaPO_4$:$Eu^{3+}$ (or $Tb^{3+}$), $LaYO_3$:$Eu^{3+}$ (or $Tb^{3+}$), $Li_2Lu_5O_4(BO_3)_3$:$Eu^{3+}$ (or $Tb^{3+}$), $Li_3Ba_2La_3(MoO_4)_8$:$Eu^{3+}$ (or $Tb^{3+}$), $Li_3La_2(BO_3)_3$:$Eu^{3+}$ (or $Tb^{3+}$), $Li_6Gd(BO_3)_3$:$Eu^{3+}$ (or $Tb^{3+}$), $Li_6Y(BO_3)_3$:$Eu^{3+}$ (or $Tb^{3+}$), $LiCaAlF_6$:$Eu^{3+}$ (or $Tb^{3+}$), $LiEu^{3+}$ (or $Tb^{3+}$), $Mo_2O_8$:$Eu^{3+}$ (or $Tb^{3+}$), $LiGd_6O_5$ $(BO_3)_3$:$Eu^{3+}$ (or $Tb^{3+}$), $LiGdF_4$:$Eu^{3+}$ (or $Tb^{3+}$), $LiGdGeO_4$: $Eu^{3+}$ (or $Tb^{3+}$), $LiGdO_2$:$Eu^{3+}$ (or $Tb^{3+}$), $LiGdSiO_4$:$Eu^{3+}$ (or $Tb^{3+}$), $LiLa_2O_2BO_3$:$Eu^{3+}$ (or $Tb^{3+}$), $LiLaGeO_4$:$Eu^{3+}$ (or $Tb^{3+}$), $LiL_4O_2$:$Eu^{3+}$ (or $Tb^{3+}$), $LiLaP_4O_{12}$:$Eu^{3+}$ (or $Tb^{3+}$), $LiLaSiO_4$:$Eu^{3+}$ (or $Tb^{3+}$), $LiLuGeO_4$:$Eu^{3+}$ (or $Tb^{3+}$), $LiLuO_2$:$Eu^{3+}$ (or $Tb^{3+}$), $LiLuSiO_4$:$Eu^{3+}$ (or $Tb^{3+}$), $LiScO_2$: $Eu^{3+}$ (or$Tb^{3+}$), $LiSr_2YO_4$:$Eu^{3+}$ (or$Tb^{3+}$), $LiSrAlF_6$:$Eu^{3+}$ (or $Tb^{3+}$), $LiY_6O_5(BO_3)_3$:$Eu^{3+}$ (or $Tb^{3+}$), $LiYF_4$:$Eu^{3+}$ (or$Tb^{3+}$), $LiYGeO_4$:$Eu^{3+}$ (or $Tb^{3+}$), $LiYO_2$:$Eu^{3+}$ (or $Tb^{3+}$), $LiYSiO_4$: $Eu^{3+}$ (or$Tb^{3+}$), $Lu_2O_2(SO_4)$:$Eu^{3+}$ (or $Tb^{3+}$), $Lu_2Si_2O_7$:$Eu^{3+}$ (or $Tb^{3+}$), $Lu_3Al_5O_{12}$:$Eu^{3+}$ (or $Tb^{3+}$), $Lu_3Al_5O_{12}$:$Yb$:$Eu^{3+}$ (or $Tb^{3+}$), $LuBO_3$:$Eu^{3+}$ (or $Tb^{3+}$), $LuBO_3$ (calcite):$Eu^{3+}$ (or $Tb^{3+}$), $LuOCl$:$Eu^{3+}$ (or $Tb^{3+}$), $LuPO_4$:$Eu^{3+}$ (or $Tb^{3+}$), $Mg_2Gd_8(SiO_4)_6O_2$:$Eu^{3+}$ (or $Tb^{3+}$), $Mg_2La_8(SiO_4)_6O_2$:$Eu^{3+}$ (or $Tb^{3+}$), $MgO$:$Eu^{3+}$ (or $Tb^{3+}$), $MgSiO_3$:$Eu^{3+}$ (or $Tb^{3+}$), $Na_3YSi_3O_9$:$Eu^{3+}$ (or $Tb^{3+}$), $Na_6Gd(BO_3)_3$:$Eu^{3+}$ (or $Tb^{3+}$), $NaGdGeO_4$:$Eu^{3+}$ (or$Tb^{3+}$), $NaGdO_2$:$Eu^{3+}$ (or $Tb^{3+}$), $NaGd$-$SiO_4$:$Eu^{3+}$ (or $Tb^{3+}$), $NaLaGeO_4$:$Eu^{3+}$ (or $Tb^{3+}$), $NaLaO_2$: $Eu^{3+}$ (or $Tb^{3+}$), $NaLaSiO_4$:$Eu^{3+}$ (or $Tb^{3+}$), $NaLuGeO_4$:$Eu^{3+}$ (or $Tb^{3+}$), $NaLuSiO_4$:$Eu^{3+}$ (or $Tb^{3+}$), $NaScO_2$:$Eu^{3+}$ (or $Tb^{3+}$), $NaSrLa(VO_4)_2$:$Eu^{3+}$ (or $Tb^{3+}$), $NaYGeO_4$:$Eu^{3+}$ (or $Tb^{3+}$), $NaYSiO_4$:$Eu^{3+}$ (or $Tb^{3+}$), $ScBO_3$:$Eu^{3+}$ (or $Tb^{3+}$), $ScOCLEu^{3+}$ (or$Tb^{3+}$), $ScPO_4$:$Eu^{3+}$ (or$Tb^{3+}$), $Sr_2B_2O_5$:$Eu^{3+}$ (or $Tb^{3+}$), $Sr_2Gd_8(SiO_4)_6O_2$:$Eu^{3+}$ (or $Tb^{3+}$), $Sr_2La_2Zn_2O_7$: $Eu^{3+}$ (or $Tb^{3+}$), $Sr_2La_2Zn_2O_7$:$Eu^{3+}$ (or $Tb^{3+}$), $Sr_2LaAlO_5$: $Eu^{3+}$ (or $Tb^{3+}$), $Sr_3(BO_3)_2$:$Eu^{3+}$ (or $Tb^{3+}$), $Sr_3(PO_4)_2$:$Eu^{3+}$ (or $Tb^{3+}$), $Sr_3(PO_4)_2$:$Sm$:$Eu^{3+}$ (or $Tb^{3+}$), $Sr_3Gd_2(BO_3)_4$: $Eu^{3+}$ (or $Tb^{3+}$), $Sr_3La_2(BO_3)_4$:$Eu^{3+}$ (or $Tb^{3+}$), $Sr_3La_6$ $(SiO_4)_6$:$Eu^{3+}$ (or $Tb^{3+}$), $Sr_3Y_2(BO_3)_4$:$Eu^{3+}$ (or $Tb^{3+}$), $Sr_5$ $(PO_4)_{3F}$:$Eu^{3+}$ (or $Tb^{3+}$), $Sr_9Ln(VO_4)_7$:$Eu^{3+}$ (or $Tb^{3+}$), $SrAl_2B_2O$:$EU^{3+}$ (or$Tb^{3+}$), $SrB_4O_7$:$Eu^{3+}$ (or$Tb^{3+}$), $SrB_6O_{10}$: $Eu^{3+}$ (or $Tb^{3+}$) $SrCO_3$:$Eu^{3+}$ (or $Tb^{3+}$), $SrGdAlO_4$:$Eu^{3+}$ (or $Tb^{3+}$), $SrHfO_3$:$Tm$:$Eu^{3+}$ (or$Tb^{3+}$), $SrLa_2BeO_5$:(4c):$Eu^{3+}$ (or $Tb^{3+}$), $SrLa_2BeO_5$:(8d):$Eu^{3+}$ (or $Tb^{3+}$), $SrLaAlO_4$:$Eu^{3+}$ (or $Tb^{3+}$), $SrLaGa_3O_7$:$Eu^{3+}$ (or $Tb^{3+}$), $SrLaO(BO_3)$:$Eu^{3+}$ (or $Tb^{3+}$), $SrO$:$Eu^{3+}$ (or$Tb^{3+}$), $SrY_2O_4$:(Sr-site):$Eu^{3+}$ (or $Tb^{3+}$), $SrY_2O_4$:(Y-site1):$Eu^{3+}$ (or$Tb^{3+}$), $SrY_2O_4$:(Y-site2):$Eu^{3+}$ (or $Tb^{3+}$), $Tb_2Mo_3O_{12}$:$Eu^{3+}$ (or $Tb^{3+}$), $Tb_2W_3O_{12}$:$Eu^{3+}$ (or $Tb^{3+}$), $TbBO_3$:$Eu^{3+}$ (or $Tb^{3+}$), $ThO_2$:$Eu^{3+}$ (or $Tb^{3+}$), X1-$Gd_2SiO_5$:$Eu^{3+}$ (or $Tb^{3+}$), X1-$Y_2SiO_5$:$Eu^{3+}$ (or $Tb^{3+}$), X2-$Y_2SiO_5$:$Eu^{3+}$ (or $Tb^{3+}$), $Y_{17.33}(BO_3)_4(B_2O_5)_2O_{16}$:$Eu^{3+}$ (or $Tb^{3+}$), $Y_2Ge_2O_7$:$Eu^{3+}$ (or $Tb^{3+}$), $Y_2GeO_5$:$Eu^{3+}$ (or $Tb^{3+}$), $Y_2O_2(SO_4)$:$Eu^{3+}$ (or $Tb^{3+}$), $Y_2O_2S$:$Eu^{3+}$ (or $Tb^{3+}$), $Y_2O_2S$: $Eu^{3+}$ (or $Tb^{3+}$), $Y_2O_3$:$Eu^{3+}$ (or $Tb^{3+}$), $Y_2P_4O_{13}$:$Eu^{3+}$ (or $Tb^{3+}$), $Y_2Si_2O_7$:$Eu^{3+}$ (or $Tb^{3+}$), $Y_2SiO_5$:$Eu^{3+}$ (or $Tb^{3+}$), $Y_3Al_5O_{12}$:$Eu^{3+}$ (or $Tb^{3+}$), $Y_3O_4Br$:$Eu^{3+}$ (or $Tb^{3+}$), $Y_3O_4Cl$: $Eu^{3+}$ (or $Tb^{3+}$), $Y_3PO_7$:$Eu^{3+}$ (or $Tb^{3+}$), $Y_4GeO_8$:$Eu^{3+}$ (or $Tb^{3+}$), $Y_8P_2O_{17}$:$Eu^{3+}$ (or $Tb^{3+}$), $YAl_3(BO_3)_4$:$Eu^{3+}$ (or $Tb^{3+}$), $YAlO_3$:$Eu^{3+}$ (or $Tb^{3+}$), $YBO_3$:$Eu^{3+}$ (or $Tb^{3+}$), $YbOBr$:$Yb$: $Eu^{3+}$ (or $Tb^{3+}$), $YF_3$:$Eu^{3+}$ (or $Tb^{3+}$), $YOBr$:$Eu^{3+}$ (or $Tb^{3+}$), $YOCl$:$Eu^{3+}$ (or $Tb^{3+}$), $YOCLEu^{3+}$ (or $Tb^{3+}$), $YOF$:$Eu^{3+}$ (or $Tb^{3+}$), $YOF$:$Eu^{3+}$ (or $Tb^{3+}$), $YP_3O_9$:$Eu^{3+}$ (or $Tb^{3+}$), $YPO_4$: $Eu^{3+}$ (or $Tb^{3+}$), $YTaO_4$:$Eu^{3+}$ (or $Tb^{3+}$), $YVO_4$:$Eu^{3+}$ (or $Tb^{3+}$), $ZrP_2O_7$:$Eu^{3+}$ (or $Tb^{3+}$), $Y_3Al_5O_{12}$:$Ce^{3+}$, $Lu_3Al_5O_{12}$: $Ce^{3+}$ or mixtures thereof.

The skilled person will understand that the notation :$Eu^{3+}$ (or :$Tb^{3+}$ or :$Ce^{3+}$ or :$Mn^{2+}$ or :$Mn^{4+}$) indicates that the host lattice is doped with $Eu^{3+}$ (or with $Tb^{3+}$, or with $Ce^{3+}$ or with $Mn^{2+}$ or with $Mn^{4+}$).

The Second Luminescent Material

As discussed, the first luminescent material may comprise nanoparticles according to the invention. In compositions wherein the first luminescent material comprises the nanoparticles according to the invention, the second luminescent material is preferably as described below. More preferably, the first luminescent is $Y_2O_3$:RE nanoparticles of the invention, wherein RE is europium(III) or terbium(III) or a combination thereof, and the second luminescent material is as described below.

Any suitable inorganic luminescent material may be used as second luminescent material. The second material is capable of absorbing light in a second wavelength range. The second wavelength may be any wavelength range of interest.

Preferably, the second luminescent material has one or more excitation bands in the wavelength range between 380 to 580 nm, preferably wherein said second luminescent material has one or more excitation bands in the UV-A (315 to 400 nm), violet (400 to 440 nm), blue (440 to 480 nm) or green (510 to 560 nm) wavelength range, most preferably in the blue (440 to 480 nm) wavelength range. LEDs based on (Al,In,Ga)N provide efficient "pump" light generation in the violet to blue wavelength range (about 400 nm to about 480 nm). Examples of blue-excitable materials are $CaAlSiN_3$: $Eu^{2+}$, $Y_3Al_5O_{12}$:$Ce^{3+}$, $CsPbBr_3$, CdSe, InP.

In other aspects of the invention, the second luminescent material is a material having one or more excitation bands between 700 and 1400 nm (IR-A), between 580 and 600 nm (amber and/or orange), between 560 and 580 nm (yellow), between 510-560 nm (green), between 480 and 510 nm (cyan), between 440 and 480 nm (blue), between 400-440 nm (violet), between 315-400 nm (UV-A), and/or between 280-315 nm (UV-B).

In another preferred embodiment, the host lattice of the second luminescent material is a garnet, fluoride, silicate, phosphate or nitride, more preferably selected from the group consisting of $Y_3Al_5O_{12}$ ("YAG"), $Lu_3Al_5O_{12}$ ("LuAG"), $MgF_2$, $CaF_2$, $Sr_2SiO_4$, $Ba_2SiO_4$, $Ca_2MgSi_2O_7$, $LiSrPO_4$, $CaAlSiN_3$ or a combination thereof. Preferably, said preferred host lattice of the second luminescent material is doped with one or more ions selected from of the group consisting of $Eu^{2+}$, $Pb^{2+}$, $Bi^{3+}$ and $Ce^{3+}$, more preferably $Eu^{2+}$ or $Ce^{3+}$ in combination with $Tb^{3+}$, most preferably $Ce^{3+}$ in combination with $Tb^{3+}$.

Preferably, the host lattice of the second luminescent material or precursor thereof is a garnet, such as $Y_3Al_5O_{12}$ ("YAG") or $Lu_3Al_5O_{12}$ ("LuAG") or a combination thereof. Most preferably, the host lattice is selected from the group consisting of $Y_3Al_5O_{12}$ ("YAG") or $Lu_3Al_5O_{12}$ ("LuAG") or a combination thereof and the dopant includes $Ce^{3+}$, optionally in combination with $Tb^{3+}$.

Preferably, in the case of $Ce^{3+}$ doping, the second luminescent material has a host lattice doped at a level of 0.05-5%, more preferably 0.1-4%.

Preferably, the first material is the $Y_2O_3$:RE nanoparticles of the invention, wherein RE is europium(III), and the second material is $Y_3Al_5O_{12}$ doped with $Ce^{3+}$ or $Tb^{3+}$. More preferably, the $Y_3Al_5O_{12}$ material is provided as nanoparticles.

Preferably, the first material is the $Y_2O_3$:RE nanoparticles of the invention, wherein RE is europium(III) and/or terbium(III), and the second material is a semiconductor nanoparticle material.

In a preferred embodiment, the first material is the $Y_2O_3$: RE nanoparticles of the invention, wherein RE is europium (III), and the second material is the $Y_2O_3$:RE nanoparticles of the invention, wherein RE is terbium(III).

The invention further relates to a light-emitting device comprising the luminescent material obtainable by the method according to the invention. Preferably the light-emitting device further comprises an excitation source for the luminescent material, such as for the second luminescent material. Preferably the excitation sources is a UV-A, violet, or blue light emitting material which emits light towards the luminescent material with a wavelength of 315-400 nm (UV-A), 400-440 nm (violet), or 440-480 nm (blue), more preferably between 430-465 nm.

The invention further relates to a lighting system comprising a light emitting device according to the invention. Preferably, the lighting system is selected from the group consisting of a lamp or luminaire, office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, and decorative lighting systems, portable systems, automotive applications and green house lighting systems.

The invention further relates to the use of luminescent compositions according to the invention or luminescent materials comprising the $Y_2O_3$:RE nanoparticles of the invention as a taggant. A taggant is a marker added to materials to allow various forms of testing. The overall excitation/emission spectra of the luminescent materials and/or luminescent compositions according to the invention may have unique signatures, compared to conventional approaches, such that they may be useful as taggants in anti-counterfeiting applications. For instance, U.S. Pat. No. 7,667,828B discloses a tagging system containing multiple types of taggants that differ from each other.

The invention is further defined in the following clauses:
1. $Y_2O_3$:RE nanoparticles having a cubic crystal structure, wherein RE is a trivalent rare earth metal ion.
2. Nanoparticles according to clause 1, wherein RE is europium(III) or terbium(III) or a combination thereof.
3. Nanoparticles according to any preceding clause, which are nanoplatelets.
4. Nanoparticles according to any preceding clause, wherein the $D_{50}$ value of the smallest dimension of the nanoparticles is ≥0.5 nm and ≤100 nm, preferably ≥0.5 nm and ≤50 nm, preferably ≥0.5 nm and ≤10 nm.

5. Nanoparticles according to any preceding clause, wherein one dimension≥0.5 nm and ≤10 nm.
6. Nanoparticles according to any preceding clause, wherein the $D_{50}$ value of the smallest dimension of the nanoparticles is ≥0.5 nm and ≤10 nm.
7. Nanoparticles according to any preceding clause, capable of emitting in the red, green and/or yellow spectral range.
8. Nanoparticles obtainable by the method according to any one of clauses 9-15.
9. A method of preparing $Y_2O_3$:RE nanoparticles, comprising:
   a) providing a mixture comprising (i) an yttrium salt and/or yttrium alkoxide, (ii) a rare earth metal salt and/or rare earth metal alkoxide, and (iii) an organic solvent;
   b) optionally, subjecting the mixture to a pre-treatment step which comprises heating the mixture at a temperature of at least 80° C. and/or at a temperature such that crystal water and/or organic impurities are removed,
   c) heating the mixture at a temperature between 220° C. and 320° C. and/or at a temperature such that a precursor complex forms;
   d) subjecting the mixture to a precipitation stage, wherein a precipitate forms, said precipitation stage preferably comprising allowing the mixture to cool and/or adding an antisolvent to the mixture; and
   e) heating the precipitate at a temperature between 600° C. and 900° C. and/or at a temperature such that a cubic $Y_2O_3$ crystal structure forms, preferably for at least 10 minutes.
10. A method according to clause 9, wherein
    the yttrium salt is chosen from the group consisting of halides, acetates, acetylacetonates, sulfates, and nitrates, or a mixture thereof, and/or the hydrated versions thereof;
    the yttrium alkoxide has the formula $Y(OR)_3$, wherein $RO^-$ is the alkoxide and R is a C1-C4 group, preferably wherein the alkoxide is an isopropoxide, ethoxide and/or tert-butoxide;
    the rare earth metal salt is chosen from the group consisting of halides, acetates, acetylacetonates, sulfates, and nitrates, or a mixture thereof, and/or the hydrated versions thereof; and/or
    the rare earth metal alkoxide has the formula $RE(OR)_3$, wherein $RO^-$ is the alkoxide and R is a C1-C4 group, preferably wherein the alkoxide is an isopropoxide, ethoxide and/or tert-butoxide.
11. A method according to clause 9 or 10, wherein the organic solvent has a boiling point of at least 280° C. at a pressure of $10^5$ Pa and/or is chosen from the group of 1-octadecene, oleylamine, octadecylamine, oleic acid, or a mixture thereof.
12. A method according to any one of clauses 9 to 11, wherein, in stage b), the mixture is heated at at least about 100° C. and at most about 180° C. under atmospheric pressure, or at least 80° C. at most about 130° C. under vacuum, and/or the mixture is heated for at least 10 minutes, preferably 10 to 420 minutes.
13. A method according to any one of clauses 9 to 12, wherein, in stage c), the mixture is heated for at least 15 minutes, preferably for about 30 to about 120 minutes.
14. A method according to any one of clauses 9 to 13, wherein the antisolvent is a polar organic solvent, more preferably an alcohol or ketone, more preferably a C1-C4 alcohol or ketone, more preferably methanol, ethanol, propanol or acetone.

15. A method according to any one of clauses 9 to 14, wherein the precipitate is heated for 10-60 minutes.

16. A luminescent composition comprising the nanoparticles according to any one of clauses 1 to 8.

17. A luminescent composition according to clause 16, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein at least one of said first luminescent material or said second luminescent material comprises nanoparticles according to any one of clauses 1 to 8.

18. A luminescent composition according to clause 17, wherein the first luminescent material and second luminescent material are so arranged to each other to allow non-radiative energy transfer from the second luminescent material to the first luminescent material.

19. Luminescent composition according to any of clauses 16 to 18, wherein the first material comprises $Y_2O_3$:RE nanoparticles according to any of clauses 1 to 8, and the second material comprises $Y_3Al_5O_{12}$ ("YAG"), $Lu_3Al_5O_{12}$ ("LuAG"), or a combination thereof and the dopant includes $Ce^{3+}$, $Tb^{3+}$, or a combination of $Ce^{3+}$ and $Tb^{3+}$.

20. Luminescent composition according to any of clauses 16 to 18, wherein the first material comprises $Y_2O_3$:RE nanoparticles according to any of clauses 1 to 8, and the second material comprises a semiconductor nanoparticle material.

21. Luminescent composition according to any of clauses 16 to 18, wherein the first material comprises $Y_2O_3$:Eu nanoplatelets according to any of clauses 3 to 8, and the second material comprises nanoparticles of $Y_3Al_5O_{12}$:Ce, $Lu_3Al_5O_{12}$:Ce or a combination thereof.

22. Luminescent composition according to any of clauses 16 to 18, wherein the first material comprises $Y_2O_3$:Eu nanoplatelets according to any of clauses 3 to 8, and the second material comprises nanoparticles of $Y_3Al_5O_{12}$:Ce,Tb, $Lu_3Al_5O_{12}$:Ce,Tb or a combination thereof.

23. Luminescent composition according to any of clauses 16 to 18, wherein the first material comprises $Y_2O_3$:Tb nanoplatelets according to any of clauses 3 to 8, and the second material comprises nanoparticles of $Y_3Al_5O_{12}$:Ce, $Lu_3Al_5O_{12}$:Ce or a combination thereof.

24. Luminescent composition according to any of clauses 16 to 18, wherein the first material comprises $Y_2O_3$:Tb nanoplatelets according to any of clauses 3 to 8, and the second material comprises nanoparticles of $Y_3Al_5O_{12}$:Ce,Tb, $Lu_3Al_5O_{12}$:Ce,Tb or a combination thereof.

25. Luminescent composition according to any of clauses 16 to 18, wherein the first material comprises $Y_2O_3$:Tb,Eu nanoplatelets according to any of clauses 3 to 8, and the second material comprises nanoparticles of $Y_3Al_5O_{12}$:Ce, $Lu_3Al_5O_{12}$:Ce or a combination thereof.

26. Luminescent composition according to any of clauses 16 to 18, wherein the first material comprises $Y_2O_3$:Tb,Eu nanoplatelets according to any of clauses 3 to 8, and the second material comprises nanoparticles of $Y_3Al_5O_{12}$:Ce,Tb, $Lu_3Al_5O_{12}$:Ce,Tb or a combination thereof.

27. Light emitting device comprising the luminescent composition according to any one of clauses 16 to 26 and a violet and/or blue light emitting semiconductor material.

28. A system comprising the luminescent composition according to any one of clauses 166 to 26 and/or a light emitting device according to Clause 27, the system being one or more of the following:
   a. office lighting systems
   b. household application systems
   c. shop lighting systems,
   d. home lighting systems,
   e. accent lighting systems,
   f. spot lighting systems,
   g. theater lighting systems,
   h. fiber-optics application systems,
   i. projection systems,
   j. self-lit display systems,
   k. pixelated display systems,
   l. segmented display systems,
   m. warning sign systems,
   n. medical lighting application systems,
   o. indicator sign systems, and
   p. decorative lighting systems
   q. portable systems
   r. automotive applications
   s. green house lighting systems
   t. display backlighting
   u. emissive displays
   v. microLEDs 29. Use of a luminescent composition according to any one of clauses 16 to 26 as a taggant, for example in applications such as anti-counterfeiting.

The invention will now further be illustrated using the following examples, without however being limited thereto.

EXAMPLES

Example 1: Synthesis of $Y_2O_3$:$Eu^{3+}$ Nanoplatelets 0.8 mmol $YCl_3 \cdot 6H_2O$ and 0.14 mmol $EuCl_3 \cdot 6H_2O$ (to provide a doping ratio of 15%) were mixed with 40 mL oleylamine. The mixture was first heated in ambient conditions (in air) to 160° C. for 30 min. Then the mixture was heated to 280° C. in for 60 min in $N_2$ atmosphere. The mixture was cooled to room temperature, washed with 20 mL ethanol, and dried.

Figure 2:
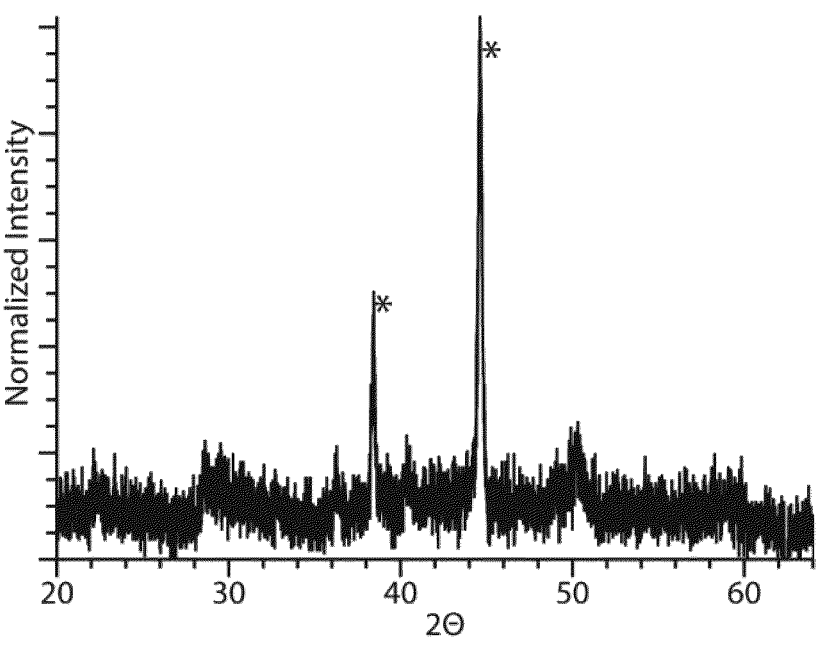
FIG. 2 shows an X-Ray Diffraction pattern (XRD) of a $Y_2O_3$:Eu³⁺ precursor complex.

The emission spectrum of this intermediate product is shown in FIG. 1. The XRD pattern of this product is shown in FIG. 2.

The intermediate product was placed in an oven at 800° C. for 30 min in ambient conditions.

Figure 3:
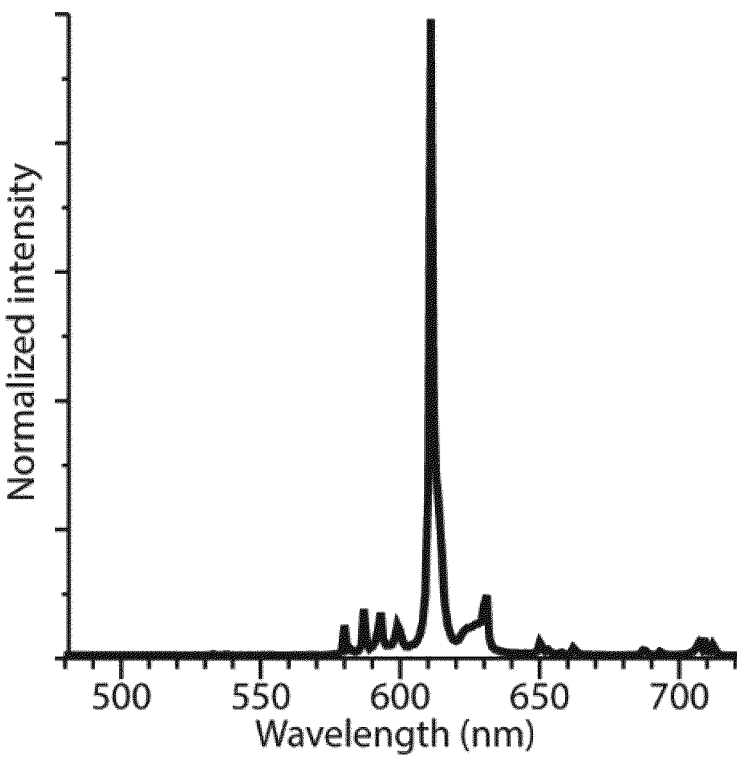
FIG. 3 shows an emission spectrum of $Y_2O_3$:Eu³⁺ nanoplatelets, with excitation at 395 nm.
Figure 4:
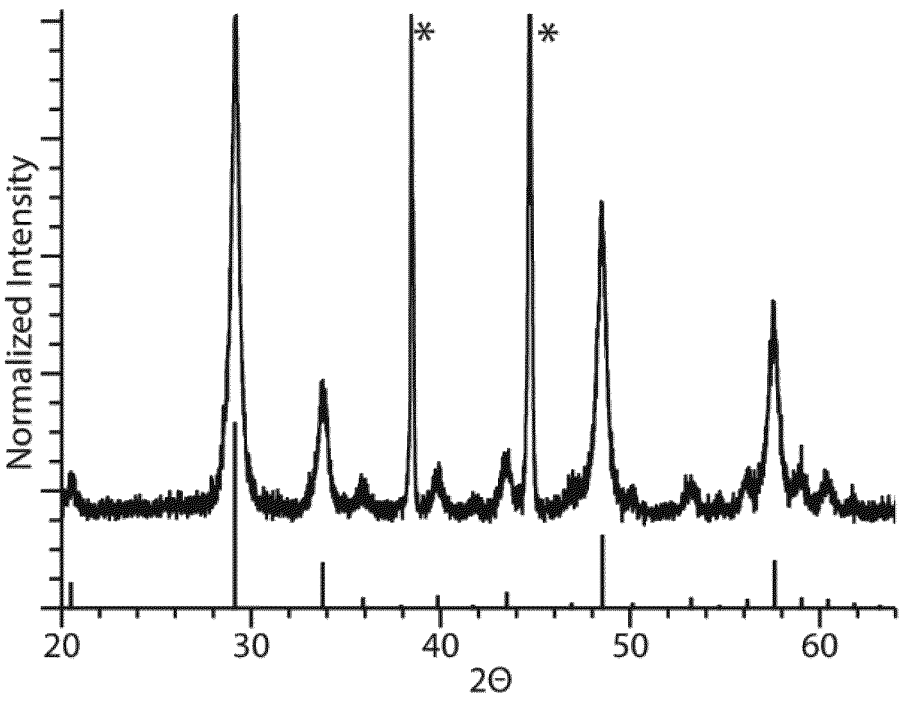
FIG. 4 shows an XRD of $Y_2O_3$:Eu³⁺ nanoplatelets.

The emission spectrum of the final product is shown in FIG. 3. The XRD pattern of the final product is shown in FIG. 4.

Example 2: Synthesis of $Y_2O_3$:$Tb^{3+}$ Nanoplatelets 0.8 mmol $YCl_3 \cdot 6H_2O$ and 0.14 mmol $TbCl_3 \cdot 6H_2O$ (to provide a doping ratio of 15%) were mixed with 40 mL oleylamine. The mixture was first heated in ambient conditions to 160° C. for 30 min. The mixture was then heated to 280° C. in for 60 min in $N_2$ atmosphere. The mixture was cooled to room temperature, washed with 20 mL ethanol, and dried.

The thickness of the intermediate product platelets was determined to be less than 5 nm.

The product was placed in an oven at 800° C. for 30 min in ambient conditions.

Figure 5:
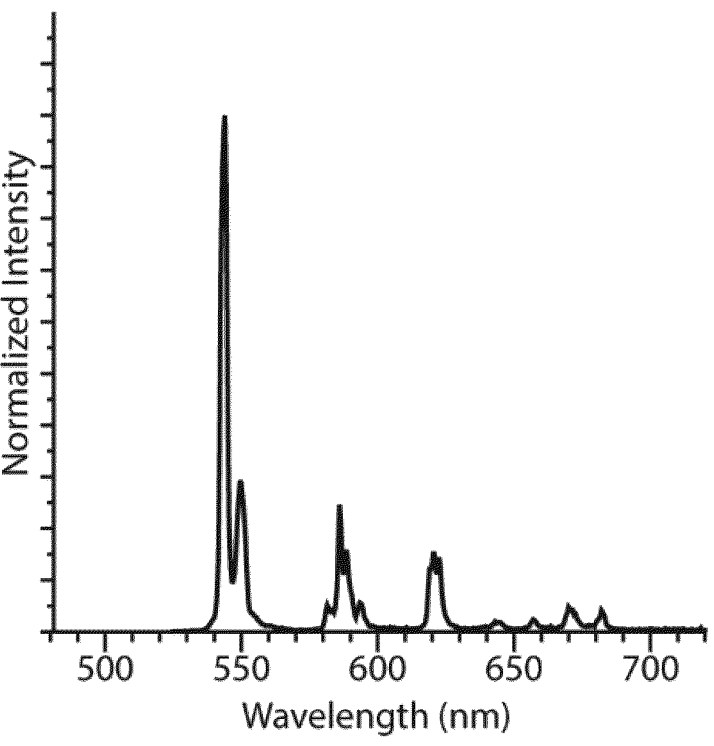
FIG. 5 shows an emission spectrum of $Y_2O_3$:Tb³⁺ nanoplatelets, with excitation at 488 nm.
Figure 6:
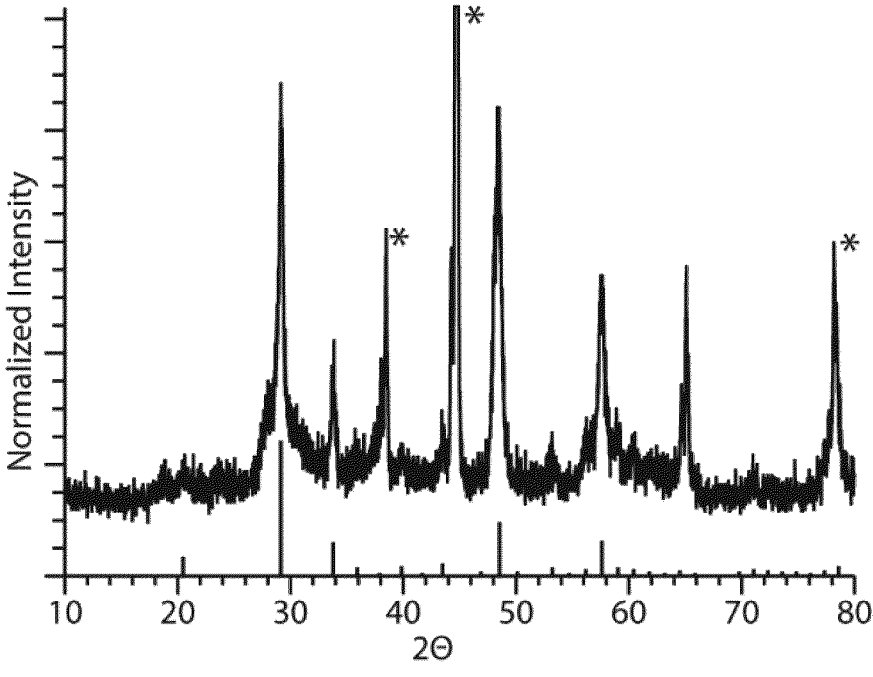
FIG. 6 provides an XRD of $Y_2O_3$:Tb³⁺ nanoplatelets.

The emission spectrum of this product is shown in FIG. 5. The XRD of this product is shown in FIG. 6.

Example 3: Evidence for Energy Transfer in LaPO$_4$:Tb$^{3+}$+Y$_2$O$_3$:Eu$^{3+}$ Mixture The following experiments were performed to show the occurrence of energy transfer in the Y$_2$O$_3$:Eu$^{3+}$ particles obtained in example 1.

The Y$_2$O$_3$:Eu$^{3+}$ particles obtained in example 1 were provided as a powder.

LaPO$_4$:Tb$^{3+}$ nanoparticles with a doping ratio of 50% were provided as a powder. The LaPO$_4$:Tb$^{3+}$ nanoparticles have a particle size of 5-10 nm and have ethylene glycol ligands on their surface.

100 g of Y$_2$O$_3$:Eu$^{3+}$ powder, and 100 g of LaPO$_4$:Tb$^{3+}$ powder were mixed and dispersed in 15 ml demineralized water.

The dispersion was shaken and stirred for a few minutes, followed by sonication for 1.5 hours in a sonication bath.

The particles were dried in the oven at 120° C., and grinded into a powder.

Then, the following measurements were performed on the mixture, and compared to the same measurements on the pure Y$_2$O$_3$:Eu$^{3+}$ as obtained in example 1.

Figure 7:
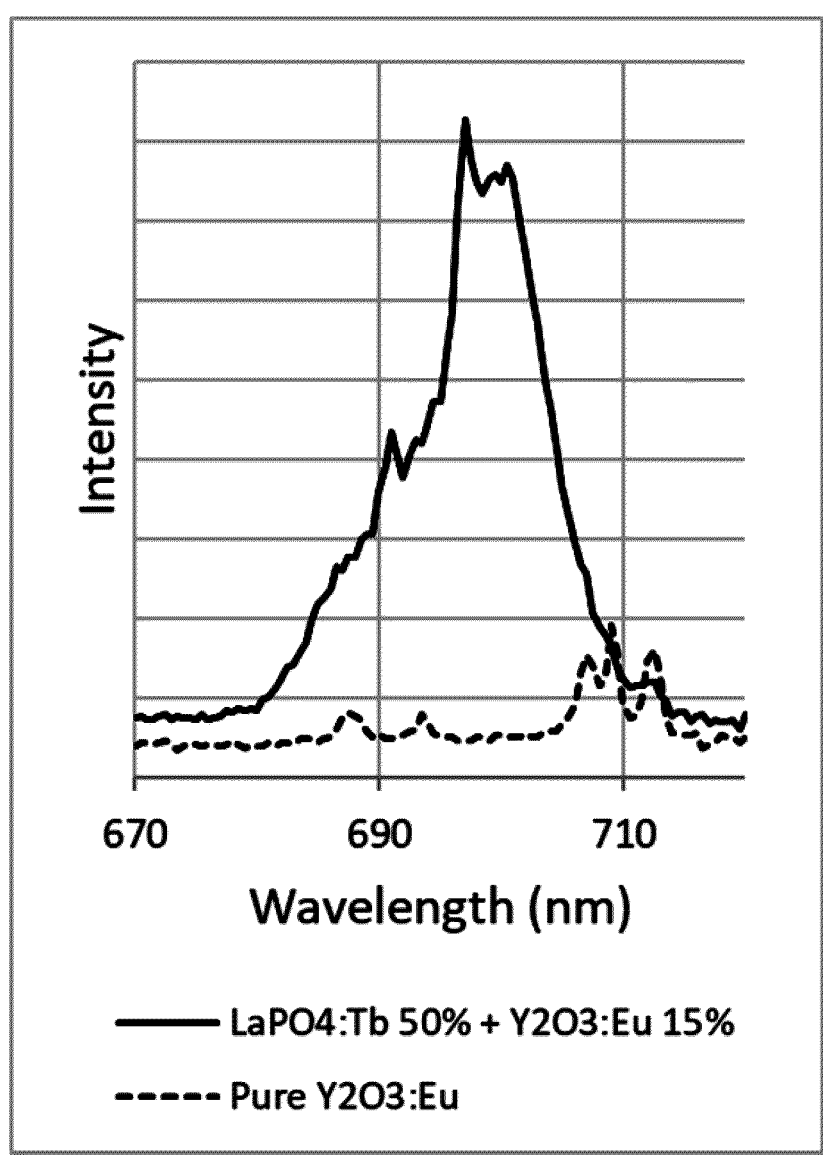
FIG. 7 provides emission spectra of a mixture of $Y_2O_3$:Eu³⁺ nanoplatelets and $LaPO_4$:Tb³⁺ nanoparticle mixtures, mixed in a 1:1 weight ratio, and of pure $Y_2O_3$:Eu³⁺ nanoplatelets. Excitation at 486 nm.

The mixture and the pure Y$_2$O$_3$:Eu$^{3+}$ obtained in example 1 were excited at 486 nm, where only Tb$^{3+}$ is excitable. FIG. 7 shows the emission intensity from 670-720 nm, where only Eu$^{3+}$ emits light. The solid line shows the emission intensity of the mixture, and the dotted line shows the emission intensity of the pure Y$_2$O$_3$:Eu$^{3+}$ material.

The mixture shows strongly increased emission in this region compared to the sample from example 1, indicating energy transfer from Tb$^{3+}$→Eu$^{3+}$.

Figure 8:
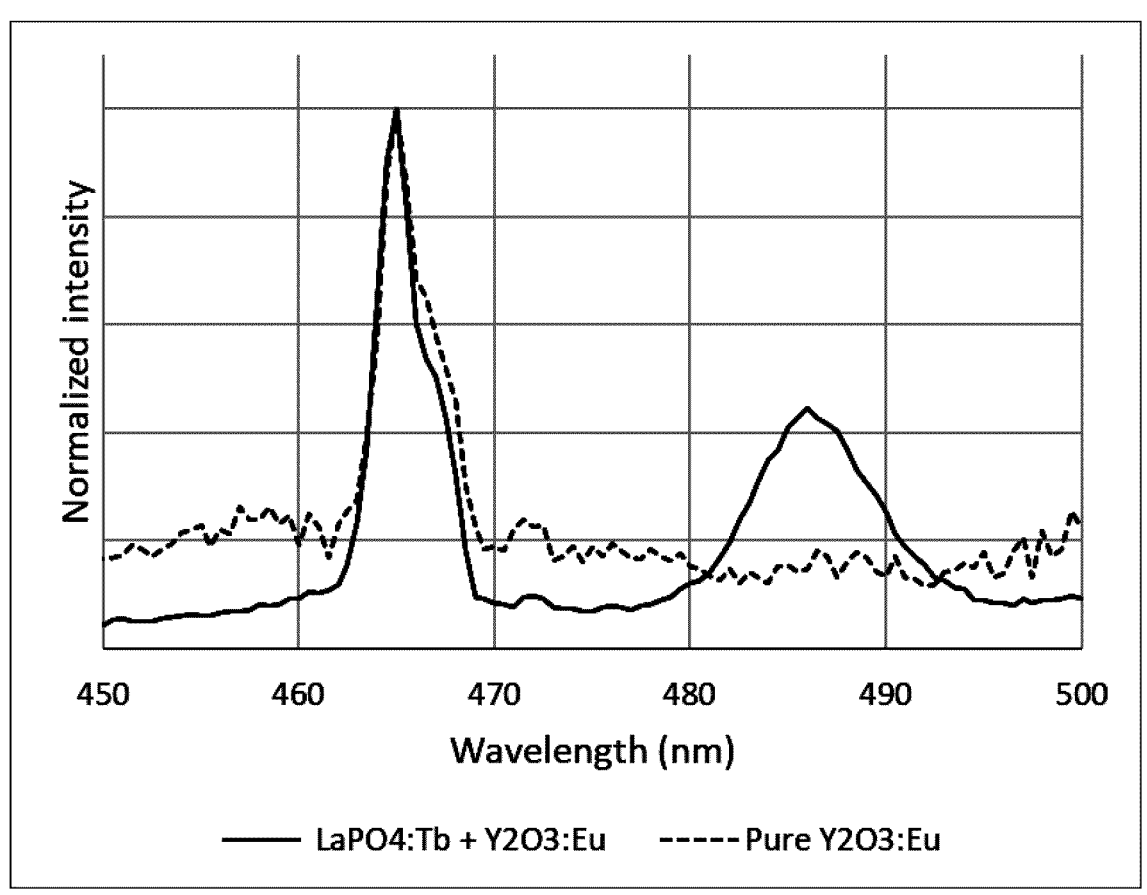
FIG. 8 provides excitation spectra of a mixture of $Y_2O_3$:Eu³⁺ nanoplatelets and $LaPO_4$:Tb³⁺ nanoparticles, mixed in a 1:1 weight ratio, and of pure $Y_2O_3$:Eu³⁺ nanoplatelets. Emission at 700 nm.

An excitation spectrum was recorded of the Eu$^{3+}$ emission at 700 nm, shown in FIG. 8. The solid line shows the excitation intensity of the mixture, and the dotted line shows the excitation intensity of the pure Y$_2$O$_3$:Eu$^{3+}$ material. For the mixture, both the Tb$^{3+}$ excitation lines and Eu$^{3+}$ excitation lines are clearly visible, indicating IFRET mechanisms.

Figure 9:
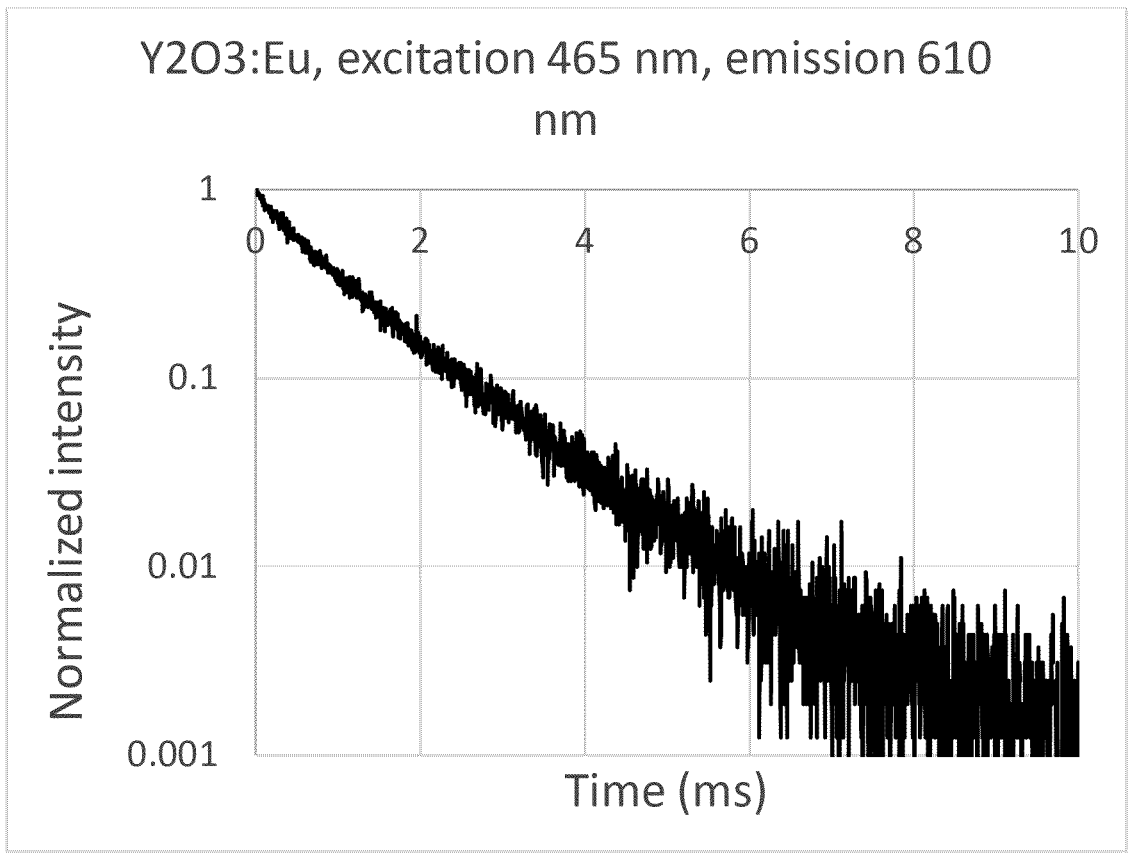
FIG. 9 shows luminescence decay in $Y_2O_3$:Eu³⁺ nanoplatelets. Excitation at 465 nm, emission at 610 nm.
Figure 10:
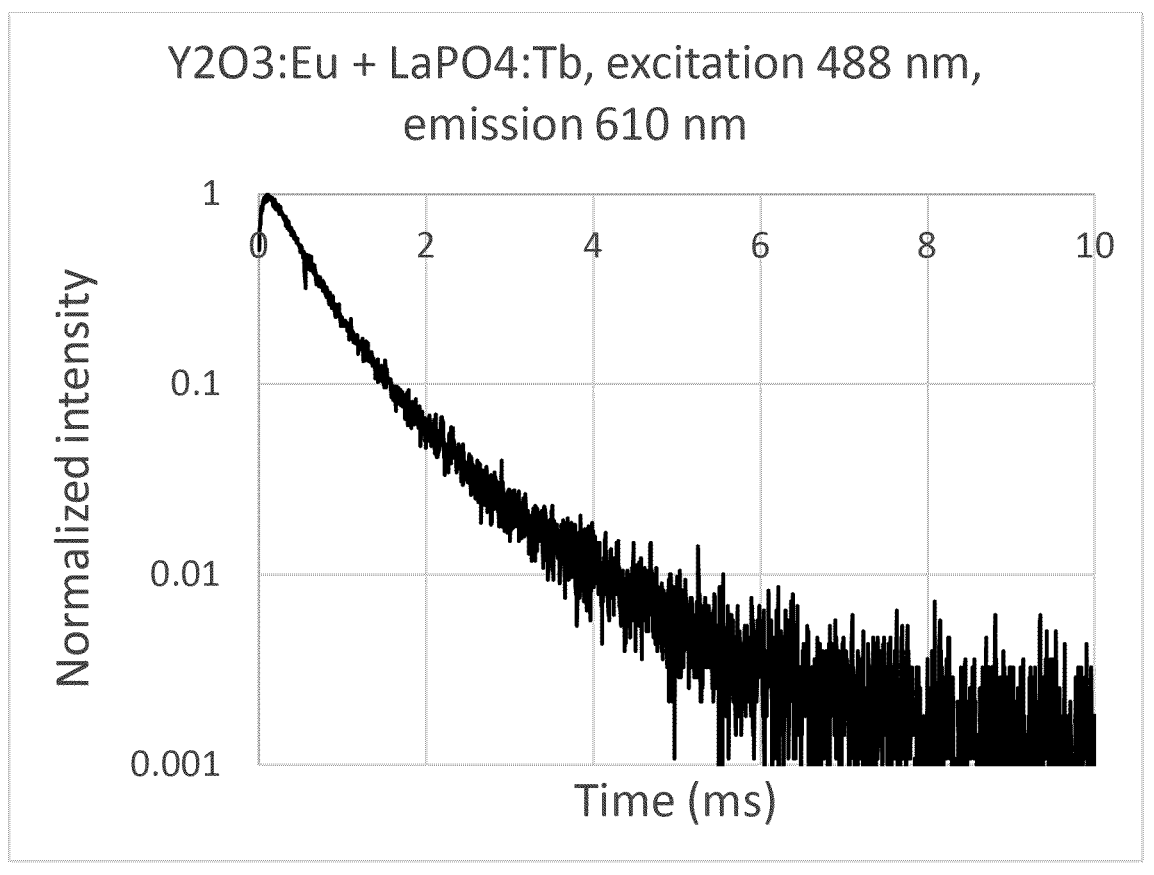
FIG. 10 shows luminescence decay in a mixture of $Y_2O_3$:Eu³⁺ nanoplatelets and $LaPO_4$:Tb³⁺ nanoparticles, mixed in a 1:1 weight ratio. Excitation at 488 nm, emission at 610 nm.

FIG. 9 shows the decay of the pure Y$_2$O$_3$:Eu$^{3+}$ material obtained in example 1. FIG. 10 shows the decay of the LaPO$_4$:Tb$^{3+}$+Y$_2$O$_3$:Eu$^{3+}$ mixture. The decay of Eu$^{3+}$ clearly shows a rise time in case of the mixture which is a typical signature of non-radiative energy transfer processes.

Example 4: Evidence for Energy Transfer in YAG: Tb$^{3+}$+Y$_2$O$_3$:Eu$^{3+}$ Mixture The following experiments were performed to show the occurrence of energy transfer in the Y$_2$O$_3$:Eu$^{3+}$ particles obtained in example 1.

Y$_2$O$_3$:Eu$^{3+}$ particles obtained in example 1 was provided as a powder.

YAG:Tb$^{3+}$ nanoparticles were provided as a 20 w % dispersion in water. The YAG:Tb$^{3+}$ nanoparticles had a particle size of 5-10 nm and had ethylene glycol ligands on their surface.

100 g of the Y$_2$O$_3$:Eu$^{3+}$ powder, and 0.5 mL of the YAG:Tb$^{3+}$ dispersion (100 g YAG:Tb$^{3+}$) were dispersed in 15 ml demineralized water.

The dispersion was shaken and stirred for a few minutes, followed by sonication for 1.5 hours in a sonication bath.

The particles were dried in the oven at 120° C.

The materials were grinded into a powder.

Then, the following measurements were performed the mixture, and compared to the same measurements on the pure Y$_2$O$_3$:Eu$^{3+}$ sample as obtained in example 1.

Figure 11:
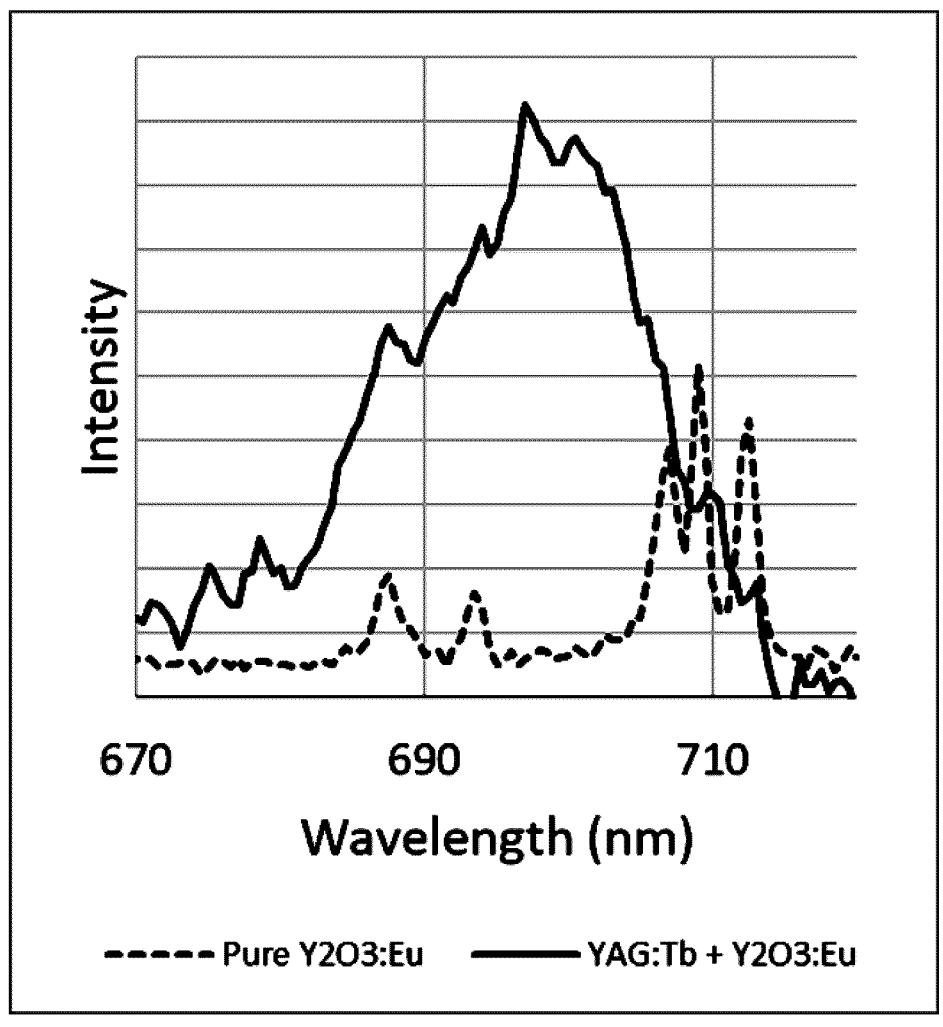
FIG. 11 provides emission spectra of a mixture of $Y_2O_3$:Eu³⁺ nanoplatelets and YAG:Tb³⁺ nanoparticles, mixed in a 1:1 weight ratio, and of pure $Y_2O_3$:Eu³⁺ nanoplatelets. Excitation at 488 nm.

The samples were excited at 488 nm, were only Tb$^{3+}$ is excitable. FIG. 11 shows the emission intensity from 670-720 nm, were only Eu$^{3+}$ emits light. The solid line shows the emission intensity of the mixture, and the dotted line shows the emission intensity of the pure Y$_2$O$_3$:Eu$^{3+}$ material. The sample obtained in example 5 shows strongly increased emission in this region, indicating energy transfer from Tb$^{3+}$→Eu$^{3+}$.

Figure 12:
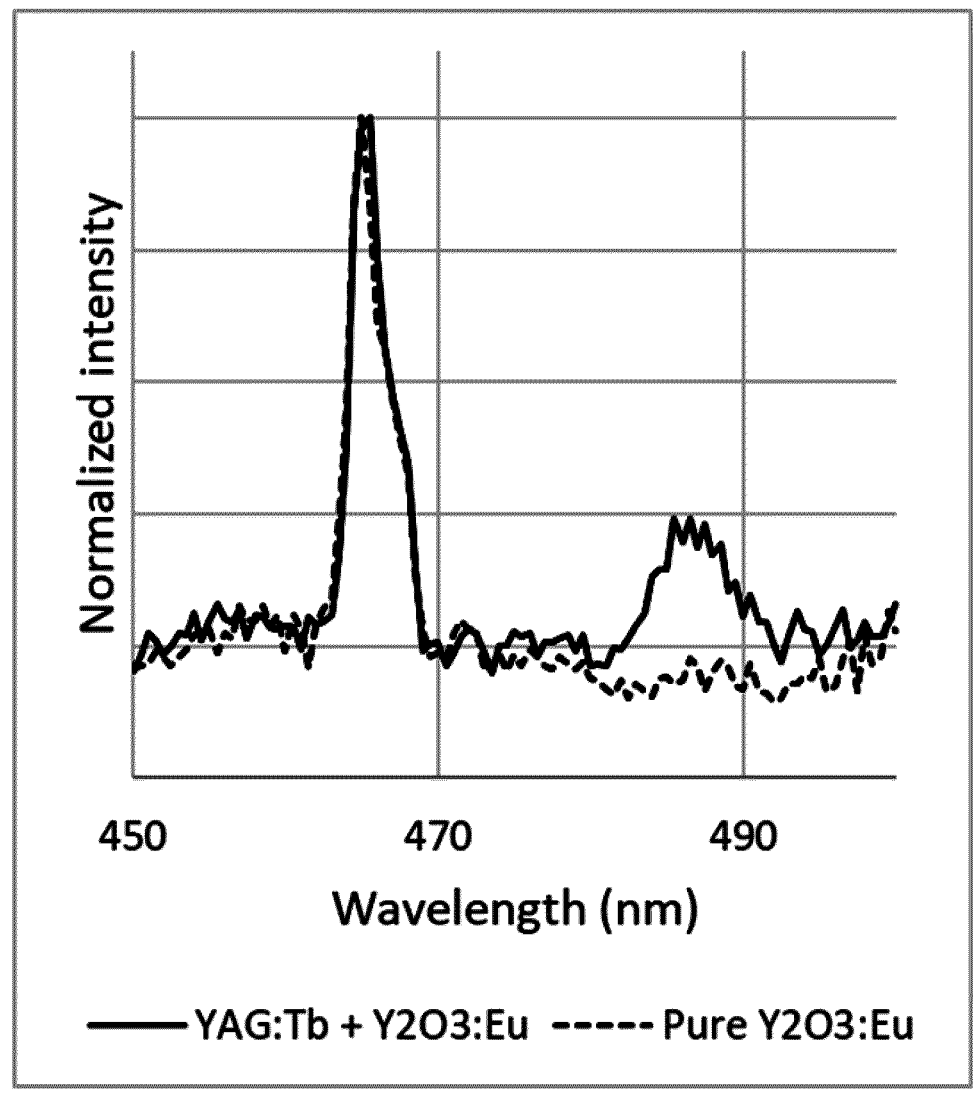
FIG. 12 provides excitation spectra of a mixture of $Y_2O_3$:$Eu^{3+}$ nanoplatelets and YAG:$Tb^{3+}$ nanoparticles and of pure $Y_2O_3$:$Eu^{3+}$ nanoplatelets, mixed in a 1:1 weight ratio. Emission at 698 nm.

An excitation spectrum was recorded of the Eu$^{3+}$ emission at 700 nm, shown in FIG. 12. The solid line shows the excitation intensity of the mixture, and the dotted line shows the excitation intensity of the pure Y$_2$O$_3$:Eu$^{3+}$ material. For the mixture obtained in this example, both the Tb$^{3+}$ excitation lines and Eu$^{3+}$ excitation lines are clearly visible, indicating IFRET mechanisms.

Example 5: Evidence for Energy Transfer in YAG: Tb$^{3+}$,Ce$^{3+}$+Y$_2$O$_3$:Eu$^{3+}$ Mixture The following experiments were performed to show the occurrence of energy transfer in the Y$_2$O$_3$:Eu$^{3+}$ particles obtained in example 1.

Y$_2$O$_3$:Eu$^{3+}$ particles obtained in example 1 was provided as a powder.

YAG:Tb$^{3+}$,Ce$^{3+}$ nanoparticles were provided as a 20 w % dispersion in water. The YAG:Tb$^{3+}$,Ce$^{3+}$ nanoparticles had a particle size of 5-10 nm.

100 g of the Y$_2$O$_3$:Eu$^{3+}$ powder, and 0.5 mL of the YAG:Tb$^{3+}$,Ce$^{3+}$ dispersion (100 g YAG:Tb$^{3+}$) were dispersed in 15 ml demineralized water.

The dispersion was shaken and stirred for a few minutes, followed by sonication for 1.5 hours in a sonication bath.

The particles were dried in the oven at 120° C.

The materials were grinded into a powder.

Then, the following measurements were performed the mixture, and compared to the same measurements on the pure Y$_2$O$_3$:Eu$^{3+}$ sample as obtained in example 1.

Figure 13:
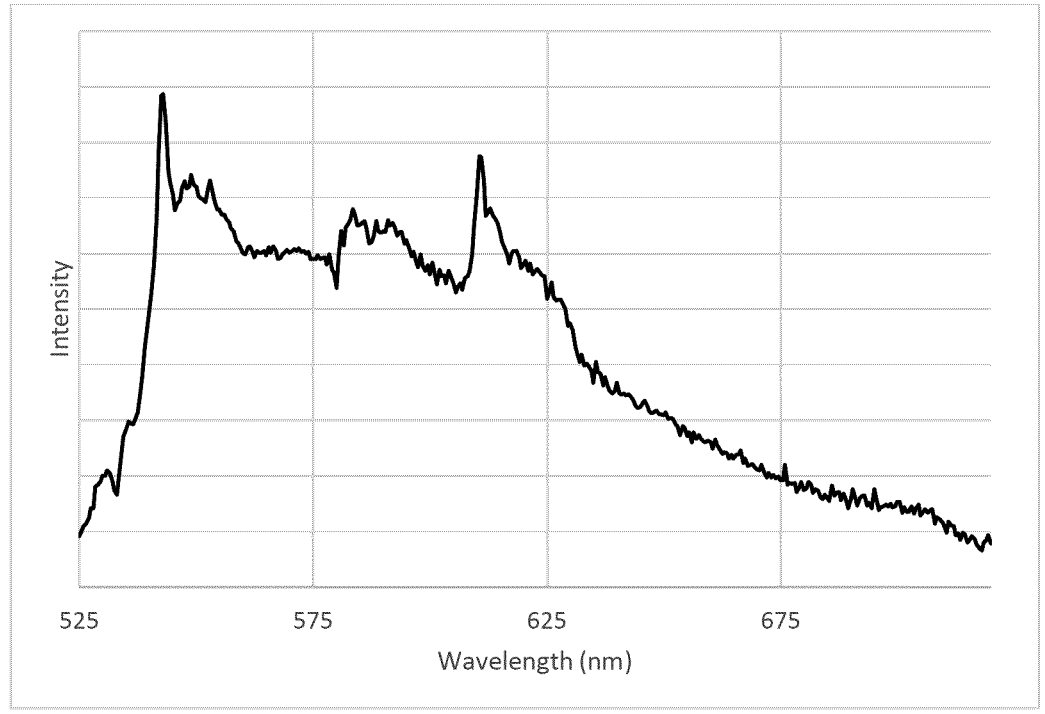
FIG. 13 provides emission spectra of a mixture of $Y_2O_3$: $Eu^{3+}$ nanoplatelets and YAG:$Tb^{3+}$,$Ce^{3+}$ nanoparticles, mixed in a 1:1 weight ratio. Excitation at 440 nm.

The samples were excited at a wavelength of 440 nm, were only Ce$^{3+}$ is directly excitable. FIG. 13 shows the emission intensity from 525-720 nm, were Ce$^{3+}$, Tb$^{3+}$ and Eu$^{3+}$ emission peaks are visible. Since Eu$^{3+}$ is not directly excitable at 440 nm this result indicates energy transfer from Ce$^{3+}$ (→Tb$^{3+}$)→Eu$^{3+}$.

Example 6: TEM Images

Figure 14:
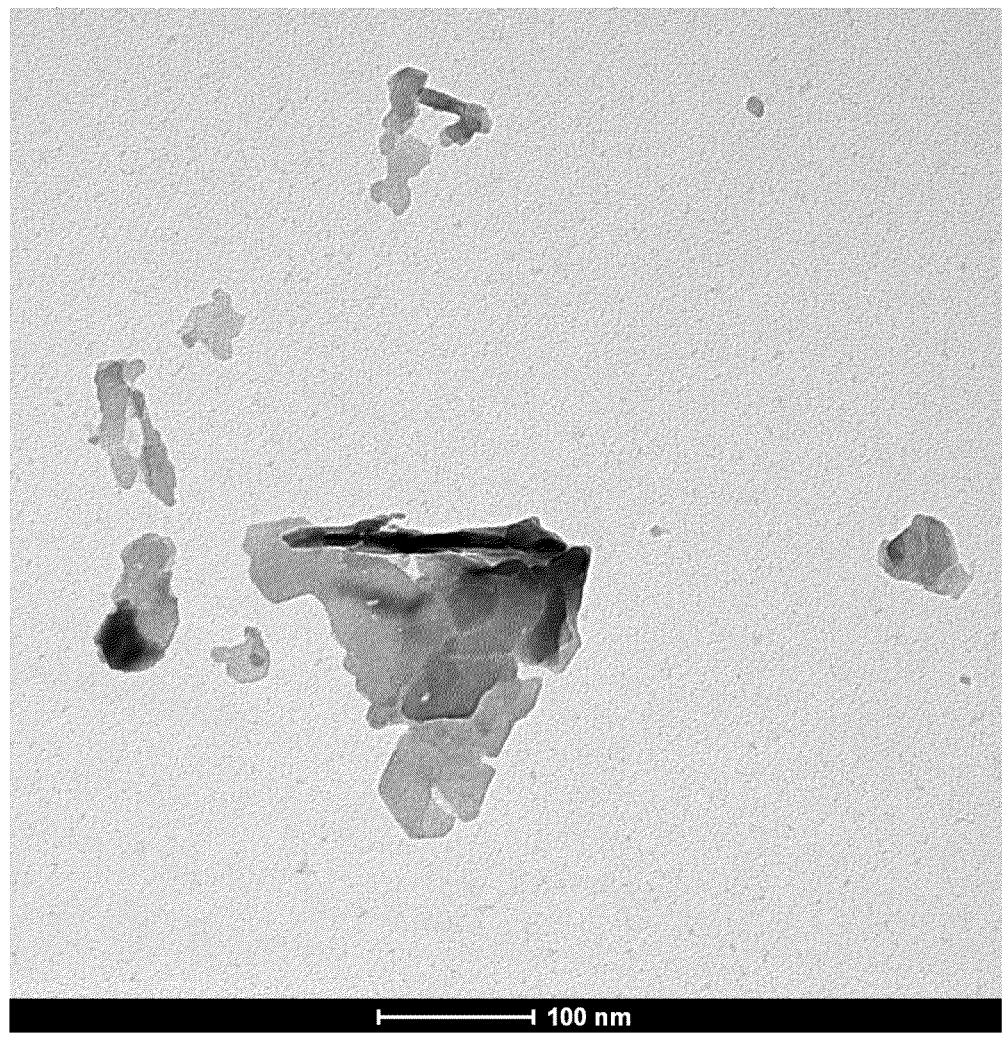
FIG. 14 provides a TEM image of the product of Example 1.

FIG. 14 shows a TEM image of the product according to Example 1. It can be observed that thin platelets have formed that (partly) roll up. The thickness of the platelets was determined to be less than 10 nm.

The invention claimed is:

1. A luminescent composition comprising Y$_2$O$_3$:RE nanoparticles having a cubic crystal structure, wherein RE is a trivalent rare earth metal ion, wherein the nanoparticles are in the form of nanoplatelets, wherein at least one dimension is ≥50 nm and ≤500 nm, and wherein the D50 value of the smallest dimension of the nanoparticles is ≥0.5 nm and ≤10 nm.

2. The composition according to claim 1, wherein RE is europium (III) or terbium (III) or a combination thereof.

3. The composition according to claim 1, wherein one dimension is ≥0.5 nm and ≤10 nm.

4. The composition according to claim 1, capable of emitting in the red, green and/or yellow spectral range.

5. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein at least one of said first luminescent material or said second luminescent material comprises the $Y_2O_3$:RE nanoparticles of claim 1.

6. The luminescent composition according to claim 5, wherein the first luminescent material and second luminescent material are so arranged to each other to allow non-radiative energy transfer from the second luminescent material to the first luminescent material.

7. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein the first material comprises the $Y_2O_3$:RE nanoparticles of claim 1, and the second material comprises $Y_3Al_5O_{12}$ ("YAG"), $Lu_3Al_5O_{12}$ ("LuAG"), or a combination thereof and the dopant includes $Ce^{3+}$, $Tb^{3+}$, or a combination of $Ce^{3+}$ and $Tb^{3+}$.

8. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein the first material comprises the $Y_2O_3$:RE nanoparticles of claim 1, and the second material comprises a semiconductor nanoparticle material.

9. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein the first material comprises the $Y_2O_3$:RE nanoparticles of claim 1, wherein RE is Eu, and the second material comprises nanoparticles of $Y_3Al_5O_{12}$:Ce, $Lu_3Al_5O_{12}$:Ce or a combination thereof, or nanoparticles of $Y_3Al_5O_{12}$:Ce,Tb, $Lu_3Al_5O_{12}$:Ce,Tb or a combination thereof.

10. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein the first material comprises the $Y_2O_3$:RE nanoparticles of claim 1, wherein RE is Tb, and the second material comprises nanoparticles of $Y_3Al_5O_{12}$:Ce, $Lu_3Al_5O_{12}$:Ce or a combination thereof, or nanoparticles of $Y_3Al_5O_{12}$:Ce,Tb, $Lu_3Al_5O_{12}$:Ce,Tb or a combination thereof.

11. The luminescent composition according to claim 1, comprising a first luminescent material capable of emitting light in a first wavelength range and a second luminescent material being capable of absorbing light in a second wavelength range, and having an emission spectrum which overlaps at least partly with one or more of the excitation bands of said first luminescent material, wherein the first material comprises the $Y_2O_3$:RE nanoparticles of claim 1, wherein RE is Tb and Eu, and the second material comprises nanoparticles of $Y_3Al_5O_{12}$:Ce, $Lu_3Al_5O_{12}$:Ce or a combination thereof, or nanoparticles of $Y_3Al_5O_{12}$:Ce,Tb, $Lu_3Al_5O_{12}$:Ce,Tb or a combination thereof.

12. A method of preparing $Y_2O_3$:RE nanoparticles, comprising:
  a) providing a mixture comprising (i) an yttrium salt and/or yttrium alkoxide, (ii) a rare earth metal salt and/or rare earth metal alkoxide, and (iii) an organic solvent;
  b) optionally, subjecting the mixture to a pre-treatment step which comprises heating the mixture at a temperature of at least 80° C. and/or at a temperature such that crystal water and/or organic impurities are removed,
  c) heating the mixture at a temperature between 220° C. and 320° C. and/or at a temperature such that a precursor complex forms;
  d) subjecting the mixture to a precipitation stage, wherein a precipitate forms; and
  e) heating the precipitate at a temperature between 600° C. and 900° C. and/or at a temperature such that a cubic $Y_2O_3$ crystal structure forms.

13. The method according to claim 12, wherein;
  the yttrium salt is chosen from the group consisting of halides, acetates, acetylacetonates, sulfates, and nitrates, or a mixture thereof, and/or the hydrated versions thereof;
  the yttrium alkoxide has the formula $Y(OR)_3$, wherein $RO^-$ is the alkoxide and R is a C1-C4 group;
  the rare earth metal salt is chosen from the group consisting of halides, acetates, acetylacetonates, sulfates, and nitrates, or a mixture thereof, and/or the hydrated versions thereof; and/or
  the rare earth metal alkoxide has the formula $RE(OR)_3$, wherein $RO^-$ is the alkoxide and R is a C1-C4 group.

14. The method according to claim 12, wherein the organic solvent has a boiling point of at least 280° C. at a pressure of $10^5$ Pa and/or is chosen from the group of 1-octadecene, oleylamine, octadecylamine, oleic acid, or a mixture thereof.

15. The method according to claim 12, wherein, in stage b), the mixture is heated at least about 100° C. and at most about 180° C. under atmospheric pressure, or at least 80° C. at most about 130° C. under vacuum, and/or the mixture is heated for at least 10 minutes.

16. The method according to claim 12, wherein, in stage c), the mixture is heated for at least 15 minutes.

17. The method according to claim 12, wherein the antisolvent is a polar organic solvent.

18. The method according to claim 12, wherein the precipitate is heated for 10-60 minutes.

19. The method according to claim 12, wherein in stage c), the precipitation stage comprises allowing the mixture to cool and/or adding an antisolvent to the mixture.

20. A composition comprising $Y_2O_3$:RE nanoparticles obtained by the method according to claim 12, wherein said $Y_2O_3$:RE nanoparticles have a cubic crystal structure, wherein RE is a trivalent rare earth metal, wherein the nanoparticles are in the form of nanoplatelets, wherein at least one dimension is ≥50 nm and ≤500 nm, and wherein the D50 value of the smallest dimension of the nanoparticles is ≥0.5 nm and ≤10 nm.

* * * * *